(12) United States Patent
Newcomb

(10) Patent No.: US 8,881,076 B2
(45) Date of Patent: Nov. 4, 2014

(54) METHOD OF PREDICTING CONTENTION BETWEEN ELECTRONIC CIRCUIT DRIVERS

(71) Applicant: Jesse Conrad Newcomb, Daly City, CA (US)

(72) Inventor: Jesse Conrad Newcomb, Daly City, CA (US)

( * ) Notice: Subject to any disclaimer, the term of this patent is extended or adjusted under 35 U.S.C. 154(b) by 0 days.

(21) Appl. No.: 13/936,354

(22) Filed: Jul. 8, 2013

(65) Prior Publication Data

US 2013/0298093 A1  Nov. 7, 2013

Related U.S. Application Data

(63) Continuation-in-part of application No. 13/345,721, filed on Jan. 8, 2012, now Pat. No. 8,484,590, which is a continuation-in-part of application No. 12/694,199, filed on Jan. 26, 2010, now Pat. No. 8,225,251, which is a continuation-in-part of application No. 13/401,704, filed on Feb. 21, 2012, now Pat. No. 8,504,957.

(60) Provisional application No. 61/183,405, filed on Jun. 2, 2009, provisional application No. 61/543,395, filed on Oct. 5, 2011, provisional application No. 61/476,320, filed on Apr. 17, 2011.

(51) Int. Cl.
*G06F 17/50* (2006.01)

(52) U.S. Cl.
CPC ........ *G06F 17/5045* (2013.01); *G06F 17/5036* (2013.01); *G06F 17/504* (2013.01)
USPC ............................ 716/106; 716/100; 716/101

(58) Field of Classification Search
USPC .......................................... 716/100, 101, 106
See application file for complete search history.

(56) References Cited

U.S. PATENT DOCUMENTS

| | | | | |
|---|---|---|---|---|
| 8,225,251 B2 * | 7/2012 | Newcomb | ...................... | 716/106 |
| 8,484,590 B2 * | 7/2013 | Newcomb | ...................... | 716/106 |
| 8,504,957 B2 * | 8/2013 | Newcomb | ...................... | 716/109 |
| 8,504,968 B2 * | 8/2013 | Newcomb | ...................... | 716/120 |
| 8,595,660 B2 * | 11/2013 | Newcomb et al. | ............ | 716/109 |

* cited by examiner

*Primary Examiner* — Sun Lin
(74) *Attorney, Agent, or Firm* — Stephen E. Zweig

(57) ABSTRACT

Software method to identify presence of multiple digital drivers disposed in a manner that creates multiple conflicting current paths in complex electronic circuit designs. Digital drivers are analyzed by expanding backwards to build a logical tree representation of the previous predecessor circuit portions that drive the digital driver's state. The previous level of predecessor circuit node states earlier in the circuit are checked to see if they simultaneously create pull up paths to power nets and pull down paths to ground nets, thus logically determining if a contention configuration is possible. This back-trace analysis is then repeated for the next previous level of predecessor circuit portions, further seeking logical contention issues within the expanding logic tree. This is continued until either no predecessor circuit portion that causes contention is found, or until a portion that does cause logical contention is found, in which case the contention digital drivers are reported.

21 Claims, 25 Drawing Sheets

METHOD OF PREDICTING CONTENTION BETWEEN ELECTRONIC CIRCUIT DRIVERS

CROSS REFERENCE TO RELATED APPLICATIONS

This invention is a continuation in part of application Ser. No. 13/345,721, Method of Predicting Electronic Circuit Floating Gates, inventor Jesse Conrad Newcomb, filed Jan. 8, 2012, now U.S. Pat. No. 8,484,590, and application Ser. No. 13/401,704, "Automated Identification of Power and Ground Nets in an Integrated Circuit Netlist", Inventor Jesse Conrad Newcomb, filed Feb. 21, 2012; application Ser. No. 13/401,704 was also a continuation in part of application Ser. No. 13/345,721; application Ser. No. 13/345,721 in turn was a continuation in part of patent application Ser. No. 12/694,199, "Circuit States", inventor Jesse Conrad Newcomb, filed Jan. 26, 2010, now U.S. Pat. No. 8,225,251; application Ser. No. 12/694,199 in turn claimed the priority benefit of U.S. provisional application 61/183,405, "Floating Gate Predictor", inventor Jesse Conrad Newcomb, filed Jun. 2, 2009; application Ser. No. 13/345,721 also claimed the priority benefit of U.S. provisional application 61/476,320, "Analysis of Electronic Circuits", Inventor Jesse Conrad Newcomb, filed Apr. 17, 2011, and the priority benefit of U.S. provisional application 61/543,395, "Analyzer of Electronic Circuits", Inventor Jesse Conrad Newcomb, filed Oct. 5, 2011; the complete contents of all these applications are incorporated herein by reference.

BACKGROUND OF THE INVENTION

1. Field of the Invention

Embodiments of the present invention relate in general to the field of electronic circuits, in particular to computer software methods of detecting errors in electronic integrated circuit designs.

2. Description of the Related Art

Electrical engineers often need to verify that a circuit will function properly, before it is fabricated as an integrated circuit. The most common way of doing this is to use simulation software, such as SPICE. However, there are many situations where an electrical circuit may have potential faults that will not be detected or predicted by simulation. Hence, the engineer often wants to employ additional checking on the circuit, using topology as an alternative to time domain simulation.

One of the most common types of circuit checks is to verify that a particular device, such as a transistor, is adequately (not improperly) connected. Standard industry practice is to subject a circuit design to peer review, wherein one might discover, upon inspection of schematics, that a transistor may be connected to a source of voltage that is too high for the ratings of that particular given device. Other common circuit checks include: inspection of transistor gate terminals to make sure they're tied to valid signals, inspection of power supply nets to make sure they're not shorted to ground nets, inspection of signal outputs to make sure they're driving the appropriate inputs elsewhere, and so on.

Modern electronic circuits, such as integrated circuit chips can often be composed of hundreds of millions of electrical components. These can include a diversity of electronic devices (e.g. field effect transistors (FET) such as PFET and NFET devices, metal oxide semiconductor field effect transistors (MOSFET), bipolar junction transistors (BJTs), and other sub-circuits, often formed from various types of simpler transistor-based circuits. Such chips are highly complex to both design and debug. As a result, there has been a substantial amount of prior art interest in both computer software methods to design complex electronic circuits, and as computer software methods to simulate the function of these complex electronic circuits.

A "net" is a term for a circuit connection that ties multiple electrical device pins together (in math terms and graph traversal terms, this is called a "node"). A whole circuit consists of many such nets (e.g. $net_1$, $net_2$, $net_3$ ... $net_n$). When a circuit is represented in the form of a computer storage file, it is usually called a "netlist". It is usually easier to at least begin analyzing more complex electronic circuits at the netlist level, and thus the computer software used to analyze such electronic circuits is sometimes referred to as "netlist analyzers".

One of the most common electronic devices in circuits is the field effect transistor, or "FET". A FET can generally be thought of as providing a valve or regulatory function, where the amount of current passing through the device is controlled by its gate terminal, or "gate". Because gates are the controlling points of the regulatory functions that FETs provide, they are of critical importance in the operation of a circuit. When a FET is used to drive a digital signal, it is often referred to as a digital driver.

As might be imagined, when highly complex integrated circuit chips are designed, their complexity soon outstrips the ability of both the human mind (and even sophisticated computer circuit design software) to understand and detect all design problems. One design problem that has been particularly difficult for prior art methods to detect and analyze is when, often due to an unintended design oversight, floating FET gates, essentially non-functional or improperly functioning portions of the circuit, are created. In a sense floating gates act somewhat like uninitialized variables in software, because their function is unpredictable (they control FETs in an unpredictable way). Floating gates can cause a complex circuit to either fail outright or act in an erratic and undesired manner.

An alternative type of problem occurs when instead of there being no gate or digital driver to a circuit, instead accidentally multiple drivers have been created. This type of situation, where the intended multiple drivers create multiple conflicting current paths at a particular net, is called "contention". Although in some types of circuits, such as analog circuits, such contention may be intended and useful; in other types of circuits contention can be harmful. This is particularly true for digital circuits. Indeed in digital circuits, unintended contention can be viewed as a type of design error that, if not caught, can cause the integrated circuit device to act unpredictably, consume excess current, generate excess heat, and even burn out.

Thus automated methods of detecting various design errors, such as floating gates and contention are of considerable interest in the field.

BRIEF SUMMARY OF THE INVENTION

The invention is based, in part, on the insight that the logic decision tree type automated floating gate analysis techniques previously taught by the inventor in parent application Ser. No. 13/345,721 (now U.S. Pat. No. 8,484,590), application Ser. No. 12/694,199 (now U.S. Pat. No. 8,225,251), U.S. patent application Ser. No. 13/401,704, and provisional applications 61/183,405; 61/476,320; 61/543,395; the contents of all of which are incorporated herein by reference, could, with some modifications, also be useful for the automated detection of contention in complex integrated circuit designs.

As per the above cited applications, the present disclosure departs from the traditional use of prior art software simulation methods, exemplified by the popular SPICE software family, and instead analyzes a complex electrical circuit by working backwards using the expanding logic tree method.

As in the previously described floating gate analysis, the present disclosure's software-based process of working backwards from smaller sets of digital drivers works by taking a computer readable electronic circuit design as input, and creating, for each smaller set of digital drivers, a logical tree. The trunk, root, or base of this logical tree rests on (starts with) the particular set of digital drivers that are being evaluated. Based on these particular digital drivers, this expanding logic tree creates an ever expanding series of branches (each from another circuit portion other than the digital drivers) that corresponds to how far backwards the analysis extends for this particular set of digital drivers. Further, by defining a set of suitable software rules (e.g. logic equations) designed to try to characterize the state of a set of digital drivers, the contention status of various digital drivers can be rapidly identified by the invention's automated methods. Thus for a complex circuit with a large number of digital drivers, the invention will produce and analyze a correspondingly large number of different logical trees.

The invention's software implemented methods may be implemented on either standard computers (e.g. a computerized system or device with at least one processor, memory, input and output devices, and the invention's software, which often will work in conjunction with standard operating system software) or computer servers with network connections to other computerized devices.

Thus in some embodiments, the invention may be a software implemented method to identify presence of multiple digital drivers disposed in a manner that creates multiple conflicting current paths in complex electronic circuit designs. The invention operates by analyzing digital drivers by expanding backwards to build a logical tree representation of the previous predecessor circuit portions that drive the digital driver's state. The previous level of predecessor circuit node states earlier in the circuit are checked to see if they simultaneously create pull up paths to power nets and pull down paths to ground nets, thus logically determining if a contention configuration is possible. This back-trace analysis is then repeated for the next previous level of predecessor circuit portions, further seeking logical contention issues within the expanding logic tree. This is continued until either no predecessor circuit portion that causes contention is found, or until a portion that does cause logical contention is found, in which case the contention digital drivers are reported.

DETAILED DESCRIPTION OF THE INVENTION

Figure 1:
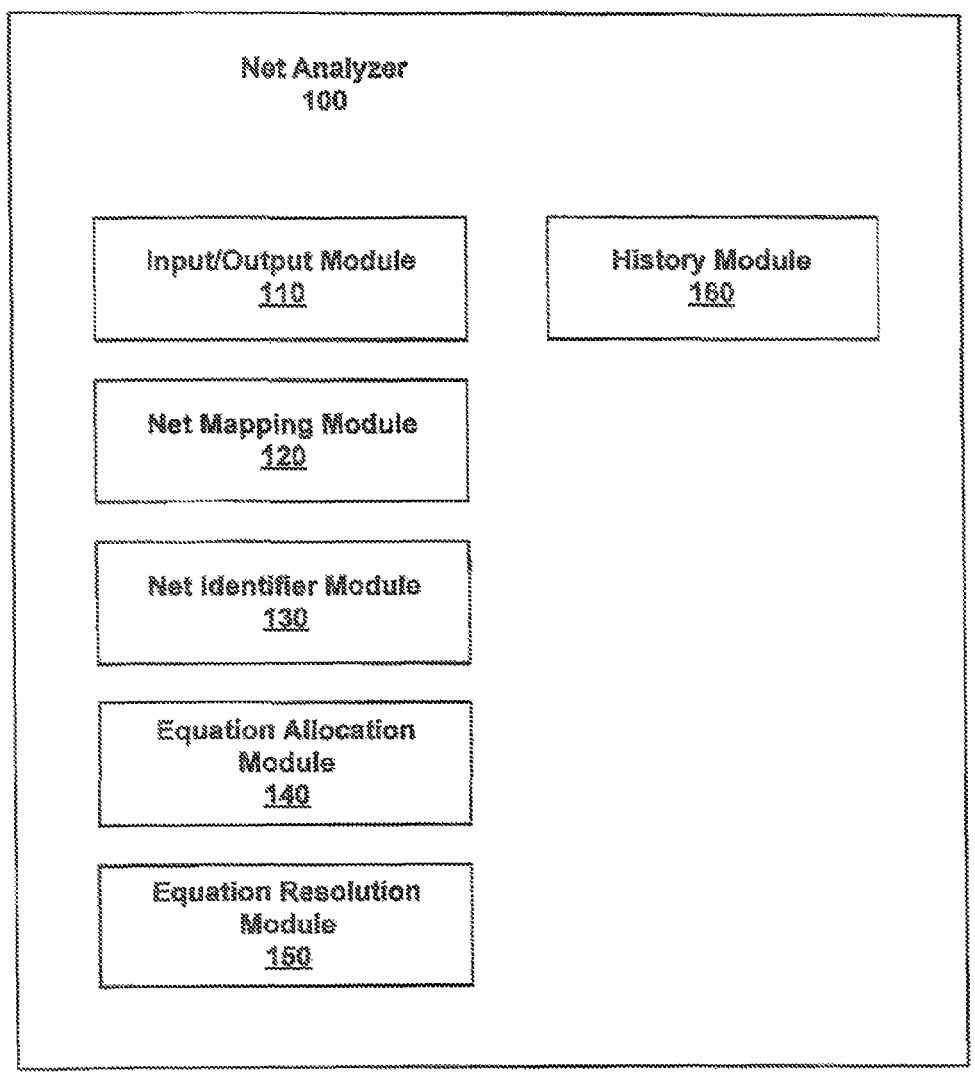
FIG. 1 illustrates a high level overview of some of the software modules of a net analyzer upon which various embodiments, such as floating gate detection and contention detection, of the present invention may be implemented.

"Contention" is generally defined as the presence of multiple unintended conflicting current paths at a particular net, usually between both a sink (pull-down path) to ground, and a source (pull-up path) to power. Unintended contention is usually bad because in addition to possible unpredictable behavior, it also causes the device to consume excess DC current. This excess current can cause an integrated circuit chip to consume more power than its specified ratings (particularly problematic for low-power products), or possibly even cause burn-out and permanent device failure.

As previously discussed, the problem of contention is usually most important for digital circuits. This is because digital signals, by definition, have a maximum voltage swing (i.e. a digital value is generally either a full power "1" or a full ground "0"). As a result, when contention exists in digital circuits, there is also the greatest amount of unwanted current flow.

To distinguish this unwanted contention from the multiple current paths that often normally and intentionally exist in analog circuits, the invention's contention detection software will often seek to detect and then ignore analog circuitry, and instead focus its contention detection efforts on contention existing between PFETs and NFET devices, particularly PFET and NFET devices that are incorporated into digital circuits. Such PFETs and NFETs devices are often separated into different circuit modules, which may be referred to as digital drivers, which are designed to operate at full voltage swing from power to ground.

Note however, that the invention does not disclaim contention detection in other situations. Instead, often guided by user configuration options, the invention may flexibly narrow down the number of different types of circuits and nets that it examines, depending upon the type of analysis desired. In some cases, for example, it may be desirable direct the software to report analog or other non-digital contention. If so, it may also be useful to direct the software to distinguish this other type of non-digital contention as being of an alternate type or lower priority type of contention.

Some specific examples of the more serious or high priority types of contention that the present contention detection invention can detect (preferably early in the design stage) include situations with two digital inverters with outputs connected together; and digital multiplexers where one input can be sampled (turned on) while another input is still sampled (on) from a previous control state.

In a preferred embodiment, the invention's software will often be set to ignore or situations such as analog bias networks that generate a voltage reference output. Indeed, unless stated otherwise, the word "contention" as used in the specification should frequently be construed as ignoring or excepting such analog cases.

At a high level then, the present disclosure extends on the previous work of Ser. No. 13/345,721 (now U.S. Pat. No. 8,484,590), application Ser. No. 12/694,199 (now U.S. Pat. No. 8,225,251), U.S. patent application Ser. No. 13/401,704, and provisional applications 61/183,405; 61/476,320; 61/543,395, in the following ways:

1) A new contention state, "contention", which is almost the opposite of a floating gate situation, is introduced. In contrast to the earlier floating gate detection methods, which can be viewed as detecting the absence of any driver, contention detection can be viewed as detecting design errors that lead to multiple (too many) drivers.

2) For contention analysis, the heuristics of which nets to eliminate from analysis, and how to find contention victims, are of course different from the earlier floating gate disclosures. These unique contention analysis heuristics are discussed in depth in this disclosure.

3) However the contention analysis methods using of expanding logic decision trees, and the basic mathematical Boolean approach of proving (or disproving) each case, is otherwise very similar to the earlier floating gate disclosures.

Thus, essentially the present disclosure expands the earlier expanding logic decision tree analysis from its earlier use in analyzing nets for 1 (pull-up), 0 (pull-down), and Z (floating, or lack of any pull-up or pull-down) situations; to now perform the additional analysis of a new contention state "X" (both pull-up and pull-down). Depending upon how the software analysis is configured, the present contention analysis software can either do contention analysis on a stand-alone basis (e.g. analyze 1, 0, and "X") or in conjunction with a floating gate analysis (e.g. analyze 1, 0, Z (floating) and X (contention)).

Thus in some embodiments, the present contention techniques can be run alongside of the earlier discussed floating gate analysis, and both floating gates and contention problems may be reported at the same time, as desired. In other embodiments only a contention analysis need be run. Put alternatively, the contention analysis can be viewed as being either a stand-alone program, or alternatively as an additional module for the floating gate software discussed previously.

Although the present disclosure thus uses the expanding logic tree methods from the earlier floating gate analysis discussed in various parent applications such as Ser. No. 13/345,721 (now U.S. Pat. No. 8,484,590), as well as drawing some optional but useful methods for power and ground net application from parent application Ser. No. 13/401,704, to avoid redundancy, and to focus on the present contention methods, these previous methods will only be reiterated here, at a relatively high level, in summary form. For additional detail, it is particularly useful to review parent application Ser. No. 13/345,721 (now U.S. Pat. No. 8,484,590), and Ser. No. 13/401,704, the complete contents of which are incorporated herein by reference.

In some embodiments then, the invention may be a computerized software implemented method for identifying instances of digital drivers that are in a contention configuration. This contention configuration will generally create multiple conflicting current paths with respect to power or ground nets in an electronic circuit design specification. This electronic circuit design specification will generally be a computer readable form of a netlist of a complex integrated circuit chip, composed of a plurality of nets and electrically interconnected transistors.

The invention's software, when loaded onto a suitable analysis computer (with at least one processor) and running, will generally operate by first reading the computer readable electronic circuit design, and will then automatically determine which of the various transistors are configured as digital drivers, usually using various criteria which will be described shortly.

Then for each net comprised of a plurality of digital drivers for which an analysis is desired (here inclusion and exclusion criteria will also be described shortly), the software will perform a logic expansion to create a logic tree representation of a previous level of predecessor circuit portions that drive a state of each said digital driver. The software will use various heuristic methods, to be described shortly, to determine if any states of predecessor nodes in the previous level of the predecessor circuit portions are such as to simultaneously create a pull up path to a power net, and a pull down path to a ground net, thereby indicating a potential contention configuration.

The software will then repeat this logic expansion for the next previous levels of the predecessor circuit portions, and will continue to look for logical conflicts within the expanding logic tree representation. This process will continue until the software can determine that either no predecessor circuit portion can cause said potential contention configuration, or until the software identifies a predecessor circuit portion that does cause a potential contention configuration.

If the software detects a predecessor circuit portion that does cause a potential contention configuration is identified, then generally the software will then report the identity of each digital driver in this potential contention predecessor circuit portion as a potential contention digital driver.

This reporting can be done by various methods. Normally the results will at least be stored in memory, and then often further analyzed and eventually output to other devices (e.g. external memory storage, display output, printed output).

As per the earlier floating gate art exemplified by Ser. No. 13/345,721 (now U.S. Pat. No. 8,484,590), the logic tree representation is a generally Boolean logic tree. Further, due to the way it operates, the method inherently provides, or can at least be readily configured to provide, a logical proof to identify that the identified digital driver in the potential contention predecessor circuit portion is a potential contention digital driver.

Note further that, in contrast to prior art time-domain simulation methods such as SPICE, the invention's methods do not depend on user submitted input conditions. This is advantageous because such user submitted input conditions are not always accurate or complete. Because the present methods operate free from user submitted input conditions, the method is able to find design errors, such as contention, that prior art time-domain type simulation methods can miss.

As will be discussed, to avoid generating too many false positives, and to alert users to the most severe or highest priority contention situations, often it will be useful to further analyze the potential contention digital drivers through either a list of exclusions, and/or a prioritization list, and then report at least the non-excluded results the users (either human or machine users) listed by priority.

Before going further into the details however, some additional background will be reviewed:
Definition of "Digital"
The overwhelmingly most common form of digital circuits in the industry is CMOS (Complementary Metal Oxide Semiconductor). CMOS circuits are wired to operate complimentarily, where either a PFET pull-up path to power is turned on, or an NFET pull-down path to ground is turned on. CMOS "output" nodes (those that drive a signal/a specific value between stages of logic) are designed to either be powered or grounded, and not left floating or in contention. Thus it is often useful to configure the contention analysis software to favor CMOS circuits over other circuit types.
Finding Digital Drivers The invention's automated analysis methods are able to automatically detect digital drivers because CMOS driver "output" nodes have some common basic characteristics. These are that in the path(s) of all NFETs to ground, there will appear gating signals that are also fully contained in the path(s) of all PFETs to power. That is, due to the complementary nature of CMOS, the same signals that gate NFETs to ground will also gate PFETs to power; When these gating signals change between digital 'one' and 'zero' states, they combine to either turn on PFETs (pull up the output), or turn on NFETs (pull down the output).

To find a digital driver, a software based inspection is made of the pull down (NFET) paths to ground, and the pull up (PFET) paths to power, from the given output node. The software traces these NFET and PFET paths, and checks that each gating signal found controlling one group of paths (for example the NFET paths) also appears as a gating signal controlling the other group of paths (for example the PFET paths).

If the software finds that a total set overlap (no differences) exists between the NFET gating signals and the PFET gating signals, then the software concludes that a CMOS logic driver has been encountered.

If (A) no set overlap exists, or (B) some diode-connected FETs are encountered, then the software will conclude that at least this portion of the circuit is analog. As previously discussed, the software will often exclude such analog circuit portions from subsequent contention checking because too many uninteresting false positives will otherwise be generated.

If the software finds that only partial set overlap exists (some union and some differences) between the NFET gating signals and the PFET gating signals, then the software concludes that the circuit is most likely dynamic logic. Dynamic logic is relatively rare, but as per analog nets often is not as interesting a candidate for contention checking. Thus in addition to excluding analog circuits from contention analysis, the software will often be configured to exclude dynamic logic from contention checking as well.

The invention is particularly useful for finding cases (which prior art found difficult to detect) where two different driver circuits, which may be relatively separated from each other in the integrated circuit design, interact in unfortunate and unexpected ways. Such problems can often occur because modern integrated circuits are often constructed by connecting various pre-existing circuit modules and the design engineers and/or the design engineering software may not have full visibility into the different modules at the time of initial design. Thus the different modules are accidentally configured with too many conflicting digital drivers, creating hidden design errors. The invention is particularly good at finding these hidden design errors.

Given that the expanding logic tree methods of the present invention are based on the inventor's earlier expanding logic tree methods discussed in parent application Ser. No. 13/345,721 (now U.S. Pat. No. 8,484,590), it is useful to present the present contention art in the context of the figures and methods previously discussed in application Ser. No. 13/345,721.

FIG. 1 illustrates a high level overview of some of the software modules of a net analyzer upon which various embodiments, such as both the floating gate detection and contention detection, of the invention may be implemented.

More specifically, FIG. 1 illustrates a block diagram of the software net analyzer (100) upon which embodiments of the present invention may be implemented. In one embodiment, the net analyzer software (100) comprises an input/output module (110), a circuit construction module (120), a net identifier module (130), a net equation allocation module (140), a net equation resolution module (150), and a history module (160). In other embodiments, modules of the net analyzer (100) are merged and/or performed outside the net analyzer (100). As previously discussed, this software (100) will be run on a computerized device, such as the server shown in FIG. 9, or other computerized device with at least one processor, memory, input and output devices, and often a network connection as well.

Figure 2:
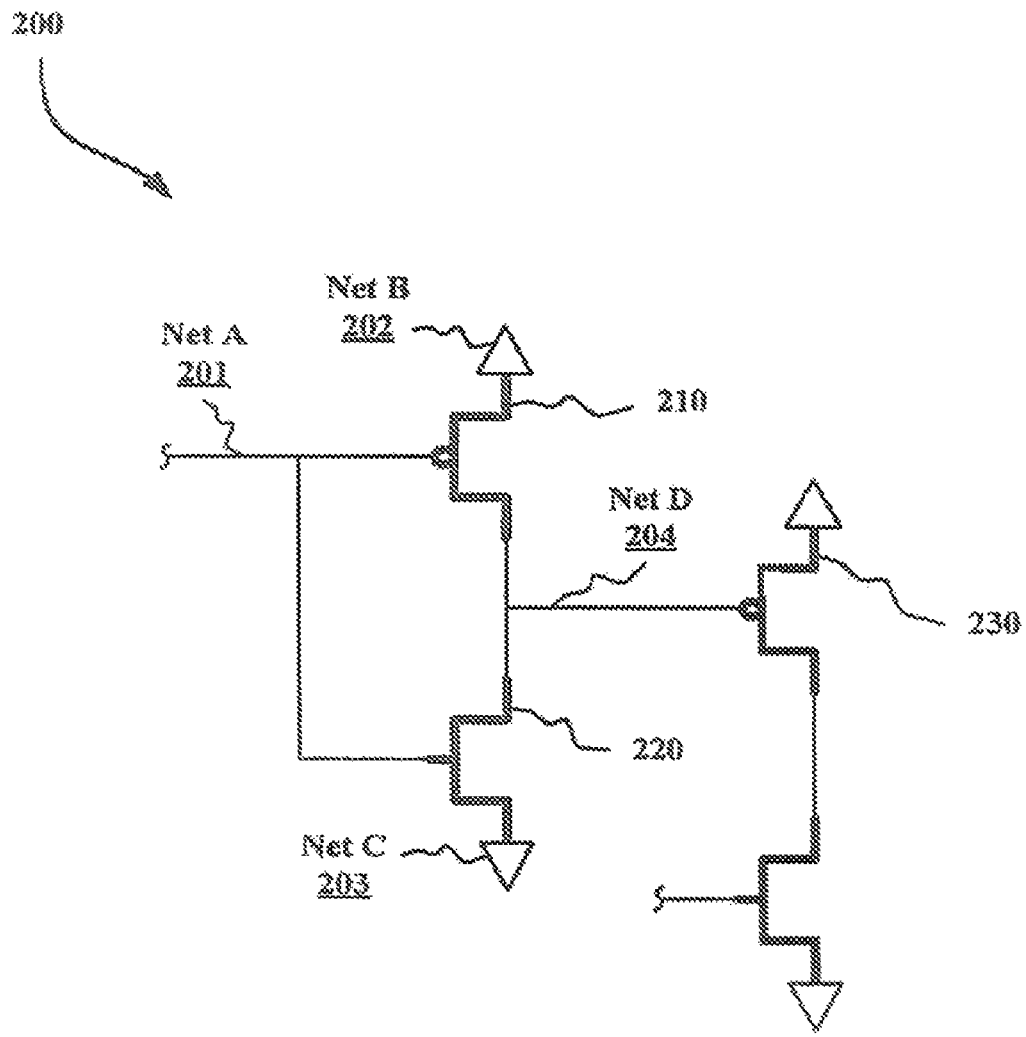
FIG. 2 illustrates an example of a non-floating net.

FIG. 2 illustrates an example (200) from application Ser. No. 13/345,721 showing an example of a non-floating net. The example (200) shows Net A (201) coupled to device (210) and device (220), Net B (202) coupled to device (210), Net C (203) coupled to device (220), and Net D (204) coupled to device (210), device (220) and device (230). In the Ser. No. 13/345,721 example (200), the net analyzer (100) determined that a gate of device (230) is coupled to the Net D (204), wherein the Net D (204) is coupled to devices that have varying states, and thereby may "suspect" that the gate of device (230) may float. To determine if the gate of device (230) may float, the net analyzer (100) assigned the proposed net state of "float" to Net D (204) represented by the expression:

Net D=Z if [device 210=Z] & [device 220=Z] (a) wherein Z signifies "float". The software also performed other logical tests that may be seen in more detail in application Ser. No. 13/345,721 and the other previously discussed citations.

By contrast, as previously discussed in Ser. No. 13/345,721, FIG. 3A shows an example of a floating gate or floating net problem.

Figure 3A:
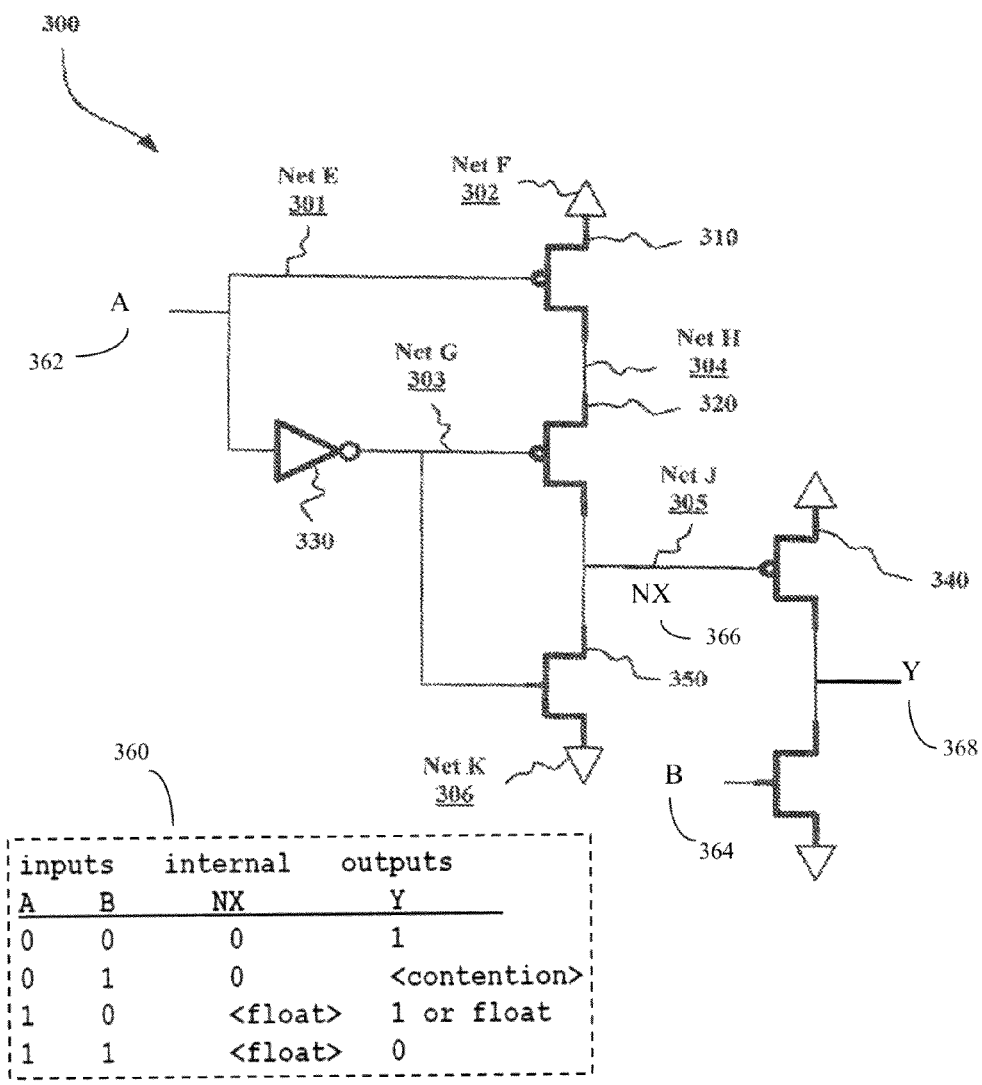
FIG. 3A illustrates an example of a floating gate or floating net problem.

More specifically, FIG. 3A example (300) shows Net E (301) coupled to device (310) and device (330), Net F (302) coupled to device (310), Net G (303) coupled to devices (320-330) and device (350), Net H (304) coupled to device (310) and device (320), Net J (305) coupled to device (320) and devices (340-350), and Net K (306) coupled to device (350). In the example (300), the net analyzer (100) determined that a gate of device (340) is coupled to the Net J (305), wherein the Net J (305) is coupled to devices that have varying states, and thereby may "suspect" that the gate of device (340) may float. To determine if the gate of device (340) may float, the net analyzer (100) assigns the proposed net state of "float" to Net J (305), wherein the hypothesis is "Does Net J float (equals Z)?", whereby the hypothesis of "Net J floats" is true if conditions are satisfied, that is, device (320) and device (350) float, and wherein the hypothesis is represented by the expression:

Net J=Z if [device 320=Z] & [device 350=Z] (e), wherein Z signifies "float". The software also performed other logical tests that may be seen in more detail in application Ser. No. 13/345,721 and the other previously discussed citations.

Figure 3B:
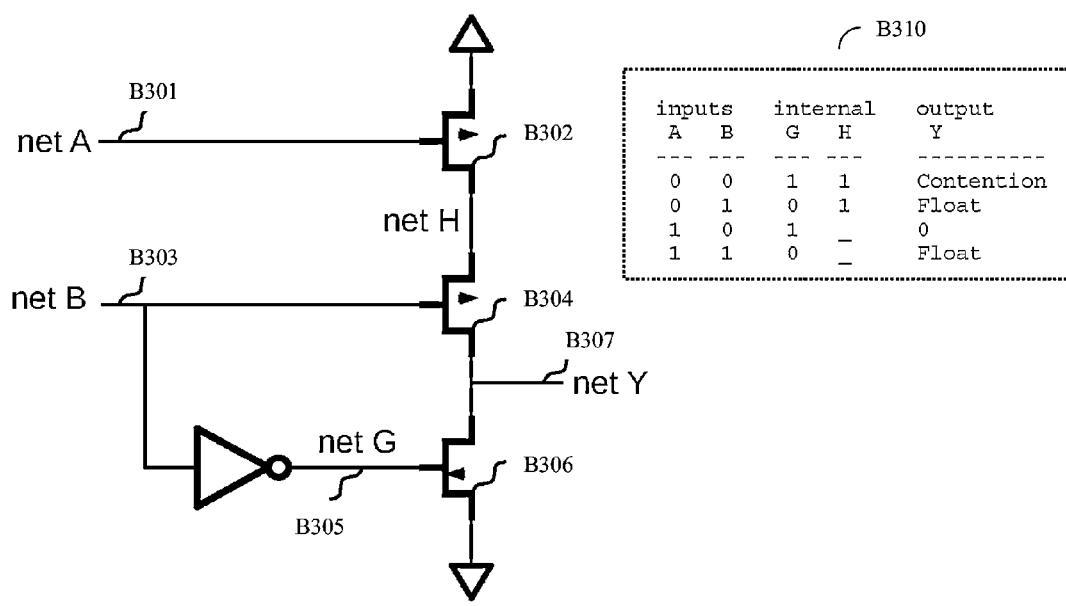
FIG. 3B illustrates a basic example of contention in both a netlist and associated truth table format.

Turning now to the present contention teaching, FIG. 3B shows a very basic example of contention in both a netlist and associated truth table format.

As previously discussed, contention may be most generally defined as the presence of multiple unintended conflicting current paths at a particular net, where both a sink (pull-down path) to ground and a source (pull-up path) to power exists.

Also as previously discussed, although strictly speaking, contention can exist in many types of circuits—digital circuits, analog circuits, dynamic logic circuits, and the like, it is generally most important or serious (for circuit design debugging purposes) when it is inadvertently introduced during the design stage for digital circuits. This is because the amount of unforeseen current flow is usually largest for digital circuits. By contrast, analog circuits often include constant current flow (which can be thought of as contention) as a deliberate design feature. So although the invention's methods can be used to call out any and all cases of contention, as a practical matter, often it is preferable to narrow down the analysis to the most important cases, and optionally also prioritize the results in terms of potential interest to the engineers who may be debugging a particular integrated circuit design.

One way to start narrowing the analysis down to a more useful level is to have the software focus on contention as it exists between various related PFET and NFET devices in digital circuits.

In one simple example of contention, the net Y (B307) is in a contention state, due to the surrounding circuit. A current sink path exists through NFET (B306) to ground, and a current source path exists through PFETs (B304) and (B302) to power. The circuit can reach a state of contention on net Y (B307) under certain circumstances. This can be proven by a logical decision tree analysis, as will be shown in FIG. 3E.

Net A (B301) goes low to turn on PFET (B302) and net B (B303) goes low to turn on PFET (B304), thus delivering a source of current from power to net Y (B307). Net B (B303) goes low to cause net G (B305) to go high, due to digital inversion. Net G (B305) turns on NFET (B306), thus delivering a current sink to ground. With both a sink and source, net Y (B307) is thus in contention. A summary of the findings that these various inputs can result in contention is also shown in truth table (B310)

Figure 3C:
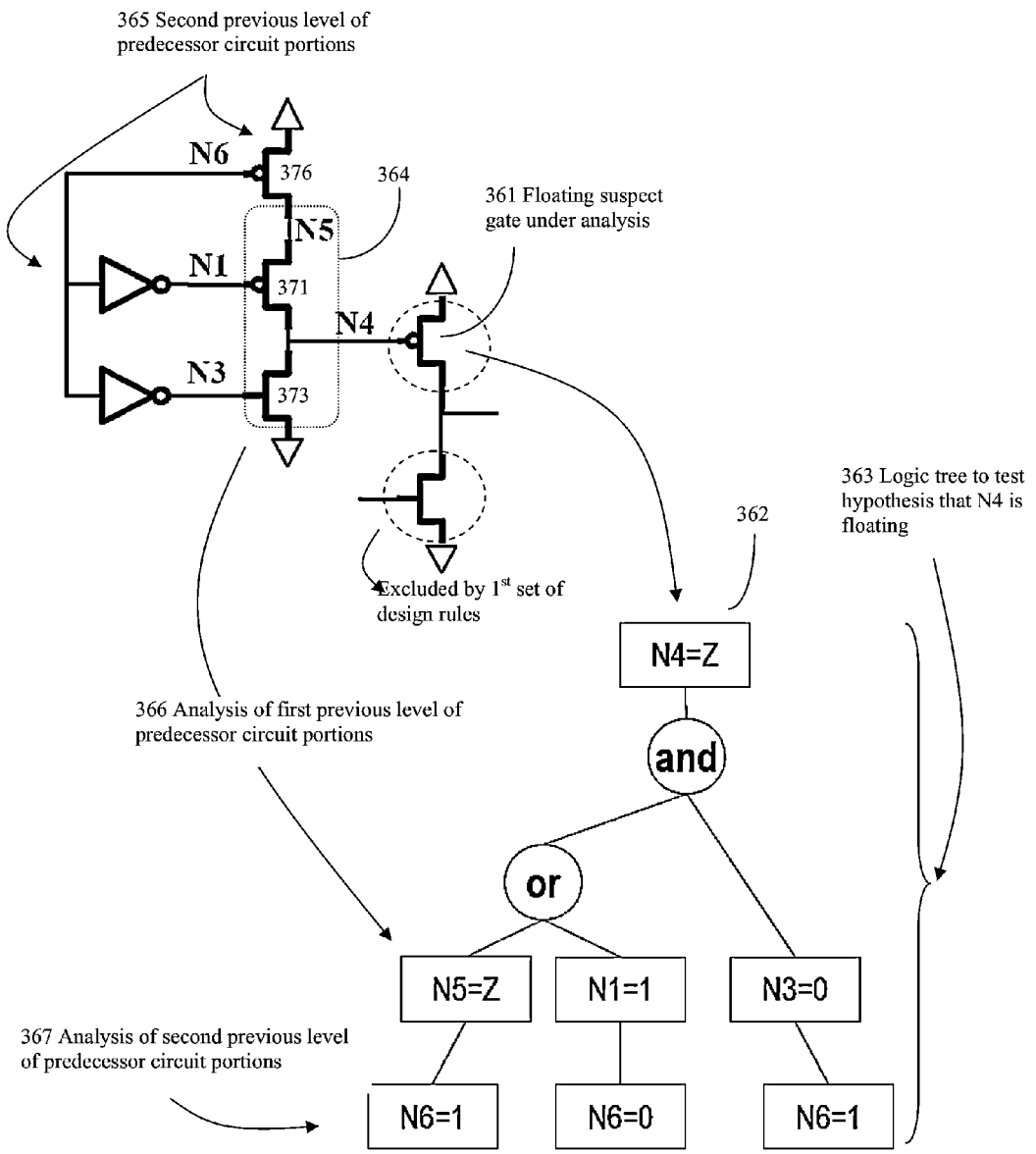
FIG. 3C illustrates an example to show how when focused on floating gate or net issues, the floating gate software operates by repeatedly selecting a floating suspect gate node from the portion of the circuit or net of interest, and working backward from this selected floating suspect gate node. The software analyzes various levels of predecessor circuit portions, and constructs, for each selected floating suspect gate node analyzed, a logic tree to test the hypothesis that this particular floating suspect gate node is in fact floating.

Returning to the earlier floating gate work that inspired the present invention, FIG. 3C illustrates an example to show how when focused on floating gate or net issues, the floating gate embodiment of the invention's methods operates by repeatedly selecting a floating suspect gate node from the portion of the circuit or net of interest, and working backward from this selected floating suspect gate node. The floating gate software analyzes various levels of predecessor circuit portions, and constructs, for each selected floating suspect gate node analyzed, a logic tree to test the hypothesis that this particular floating suspect gate node is in fact floating.

More specifically, FIG. 3C illustrates an example to show how the earlier floating gate software methods operated by repeatedly selecting a different floating suspect gate from the portion of the circuit or net of interest, and working backward from this selected floating suspect gate. The floating gate analysis software analyzed various levels of predecessor circuit portions, and constructed, for each selected floating suspect gate analyzed, a logic tree to test the hypothesis that this particular floating suspect gate was in fact floating.

In this example, assume that node N4, having the gate of transistor 361, has passed the first level screening, and has been designated as a floating suspect. The floating gate detection software sets the root or trunk (362) of the logical tree (363) with N4=Z, and begins analyzing the next ($1^{st}$ level) layer of circuitry (364), which in this case is transistors 371 and 373. Essentially the software is evaluating the truth (or "truthfulness") of the hypothesis that N4 has an undefined "Z" level (i.e. N4 is floating) under certain input conditions. The software also performed other logical tests that may be seen in more detail in application Ser. No. 13/345,721 and the other previously discussed citations.

Figure 3D:
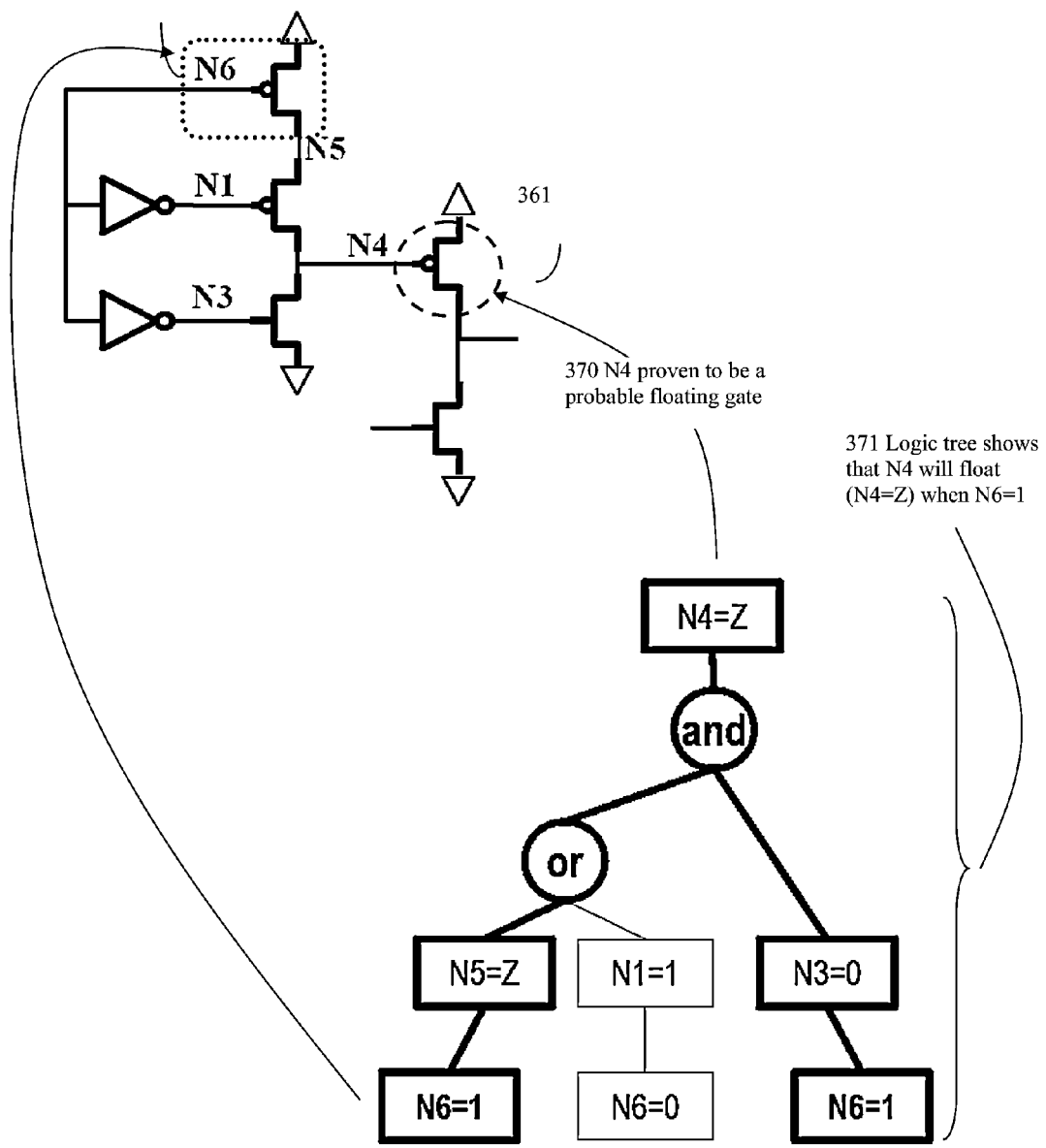
FIG. 3D further illustrates the floating gate or net example from FIG. 3C where the software has back analyzed FET gate node N4 through two levels of predecessor circuits that feed into this particular floating suspect gate node of interest. The software represents the function of these predecessor components using simplified equations, and an N4 based logic tree. This logic tree will be different for every floating suspect gate node analyzed. Here the software has used the N4 based (rooted) logic tree to determine that the floating suspect gate node "N4" will float whenever a second level predecessor component, node N6 delivers a logical 1 signal. Thus N4 has now been determined to be connected be a floating gate node, and the system has also determined that N6 is at least part of the probable cause (failure point) for why N4 floats. Similar type methods may also be used to analyze contention problems.

FIG. 3D further illustrates the floating gate or net example from FIG. 3C where the floating gate detection software had back analyzed FET gate node N4 through two levels of predecessor circuits that feed into this particular floating suspect gate node of interest. The floating gate detection software represented the function of these predecessor components using simplified equations, and an N4 based logic tree. This logic tree will be different for every floating suspect gate node analyzed. Here the floating gate analysis software used the N4 based (rooted) logic tree to determine that the floating suspect gate node "N4" will float whenever a second level predecessor component, node N6 delivers a logical 1 signal. Thus the floating gate detection software determined that N4 is (or was) connected be a floating gate node, and the system also determined that N6 is at least part of the probable cause (failure point) for why N4 floats. Similar type methods may also be used to analyze contention problems.

FIG. 3D further illustrates the example from FIG. 3C where the floating gate detection software has now back analyzed gate N4 (361) through two levels of predecessor circuits (364), (365) that feed into this particular floating suspect gate of interest (361). The floating gate detection software represented the function of these predecessor components using simplified equations (366, 367), and an N4 based logic tree. This logic tree will be different for every floating suspect gate analyzed. Here the floating gate detection software has used the N4 based (rooted, or trunk) logic tree (363, 371) to determine that the floating suspect gate "N4" will float whenever a second level predecessor component, N6 (365) delivers a logical 1 signal. Thus N4 has now been determined to be a probable floating gate (370), and the system has also determined that N6 is at least part of the probable cause (failure point) for why N4 floats (372).

Similarly, in the present contention invention, contention may also be analyzed using a similar type of expanding logic tree methodology. This is shown in FIG. 3E.

Figure 3E:
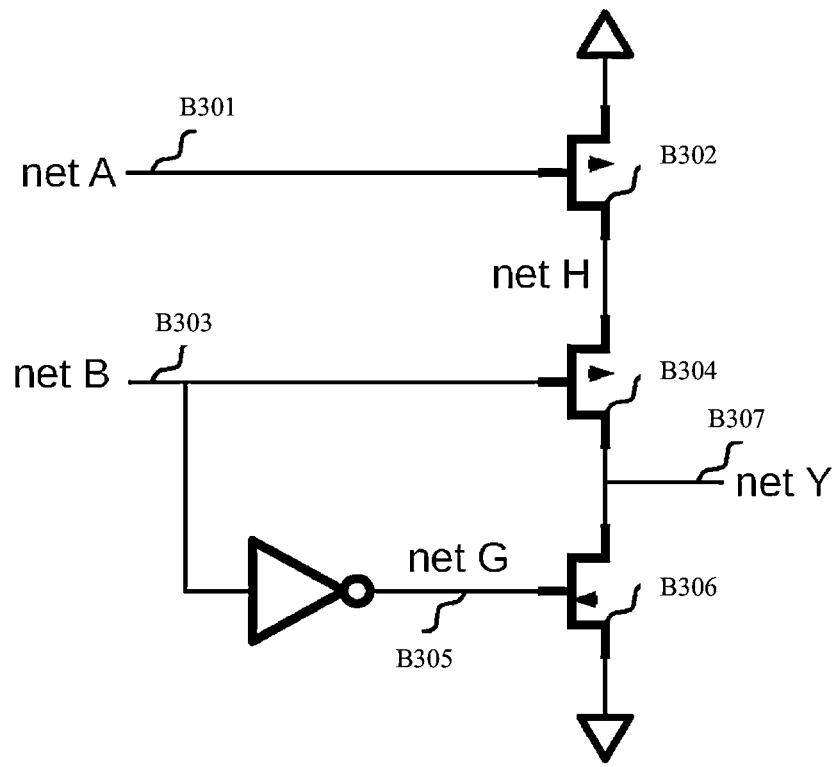
FIG. 3E shows an example of contention analyzed using the invention's expanding logic tree methodology.
Figure 3E:
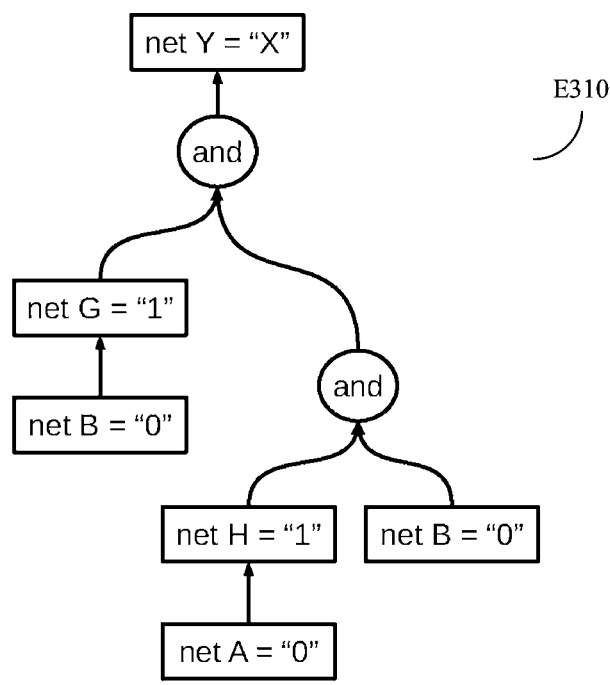

FIG. 3E shows the circuit from 3B, now further analyzed using the same type of expanding logic decision tree methods previously used for the floating gate detection software. As previously discussed for FIG. 3B, the contention detection software can determine that net Y (B307) is in a contention state, due to the surrounding circuit. A current sink path exists through NFET (B306) to ground, and a current source path exists through PFETs (B304) and (B302) to power. The circuit can reach a state of contention on net Y (B307) under certain circumstances, as proven by the decision tree (E310).

Net A (B301) goes low to turn on PFET (B302) and net B (B303) goes low to turn on PFET (B304), thus delivering a source of current from power to net Y (B307). Net B (B303) goes low to cause net G (B305) to go high, due to digital inversion. Net G (B305) turns on NFET B306, thus delivering a current sink to ground. With both a sink and source, net Y (B307) is thus in contention.

Note, however, that FIG. 3E still shows contention at a more general level. As previously discussed, running at such a general level can generate too many false positive results. Thus a more focused usefully narrowed example of contention will be discussed later on in the specification in FIG. 17 and related discussion.

Figure 3F:
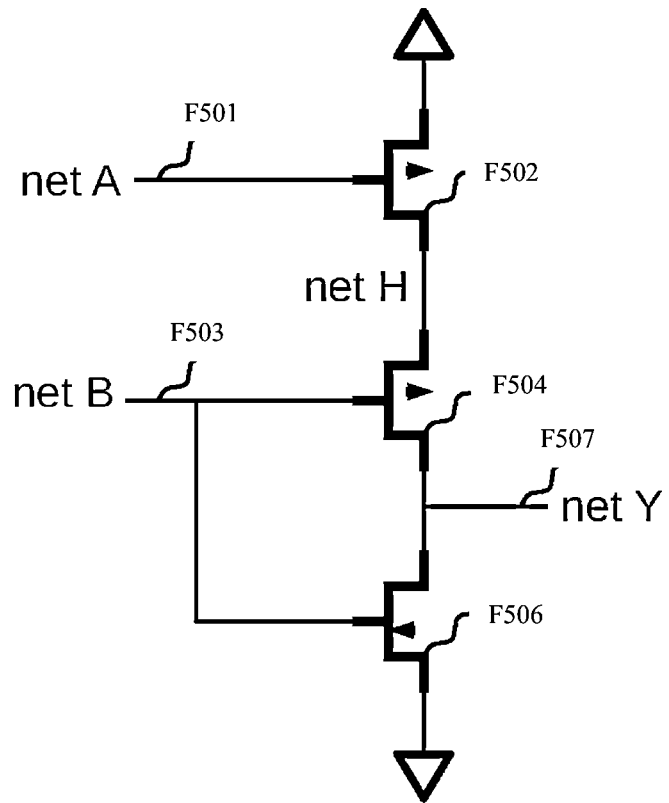
FIG. 3F shows a slightly different version of FIG. 3E, which lacks a digital inverter and thus does not reach the same contention state as FIG. 3E.
Figure 3F:
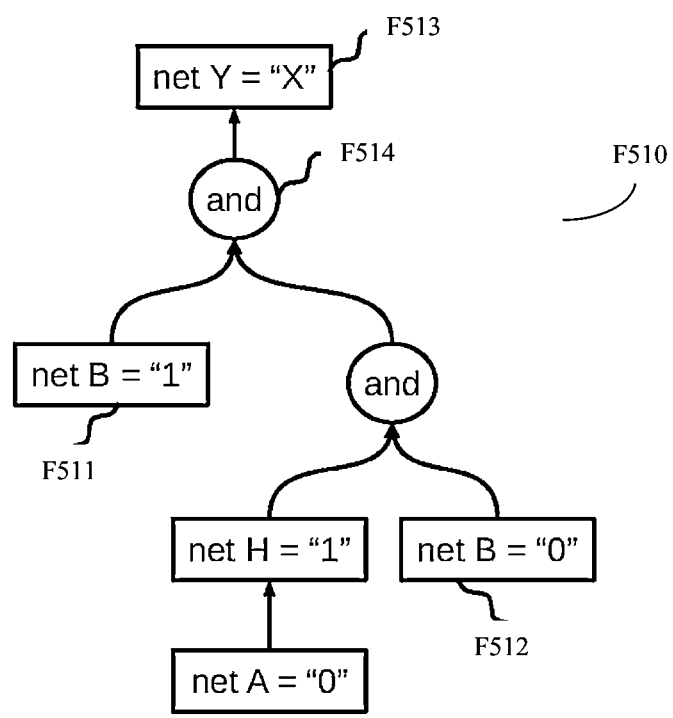

In order to illustrate how even minor differences in circuit design can have important differences in ultimate contention results, consider FIG. 3F. FIG. 3F shows a slightly different version of FIG. 3E, which lacks a digital inverter and thus does not reach the same contention state as FIG. 3E.

Thus FIG. 3F is based on FIG. 3E, but with one important difference; FIG. 3F has no digital inverter, and therefore cannot reach the same contention state that FIG. 3E has.

Here, the underlying logic is that Net B (F503) must be low to turn on PFET (F504), but the same net B (F503) must be high to turn on NFET (F506). This presents a conflict for the requirements of net B (F503), shown in the corresponding decision tree (F510). The state of net B high is represented by tree node (F511), while the state of net B low is represented by tree node (F512). Both states (F511) and (F512) lead up to the hypothesis node (F513) through "and" operator (F514), therefor ruling out this circuit net Y (F507) as contention: The net Y (F507) cannot receive a contention state because of the logical conflicts between state nodes (F511) and (F512), both of which are required.

In order better show how the present contention methods generally utilize much of the earlier floating gate teaching with respect to expanding logic trees, FIGS. 4-12 reiterate and summarize the relevant teaching from parent application Ser. No. 13/345,721 and the other previously discussed citations.

Figure 4:
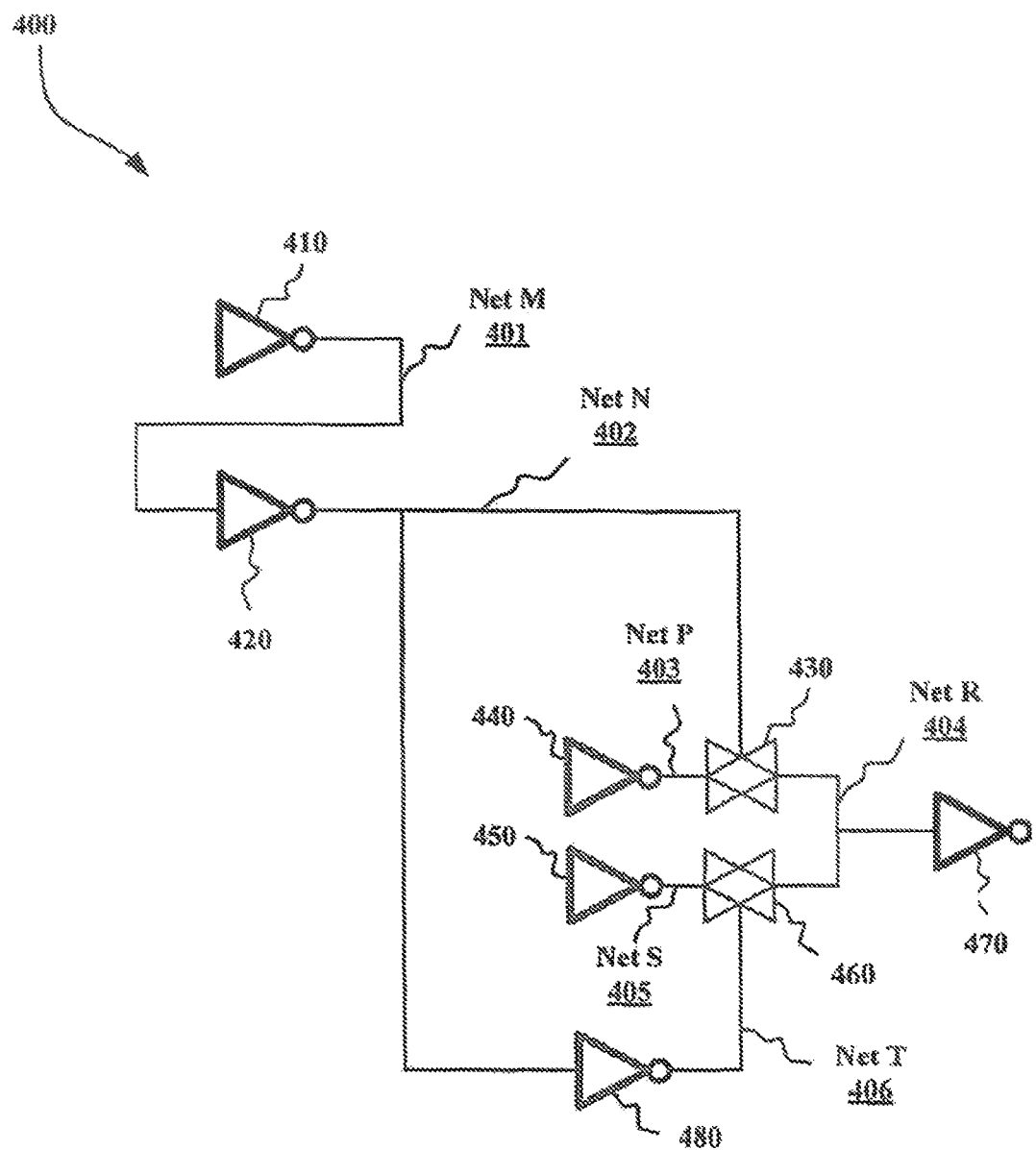
FIG. 4 illustrates another example of a non-floating node.

Returning again to the earlier floating point analysis methods, FIG. 4 illustrates another example to show that a node may not float.

More specifically, FIG. 4 illustrates another example (400) to show a situation when a net may be shown not to float. The example (400) shows Net M (401) coupled to device (410) and device (420), Net N (402) coupled to devices (420-430) and device (480), Net P (403) coupled to device (430) and device (440), Net R (404) coupled to device (430) and devices (460-470), Net S (405) coupled to device (440) and device (460), and Net T (406) coupled to device (460) and device (480). In the example (400), the floating gate detection software (net analyzer 100) determines an input to device (470) is suspect, and therefore analyzes Net R (404). To determine if the Net R (404) floats, the net analyzer 100 knows that the devices (440-450), transfer gates, need both be turned off (using determination of truth tables, as described herein), that is control equal 0, or need to have a Z input. Thus, the net analyzer 100 postulates that Net R=Z if:

[Net P=Z]|[Net N=0] & [Net S=Z] [Net T=0] (k).

The software also performed other logical tests that may be seen in more detail in application Ser. No. 13/345,721 and the other previously discussed citations.

Figure 5:
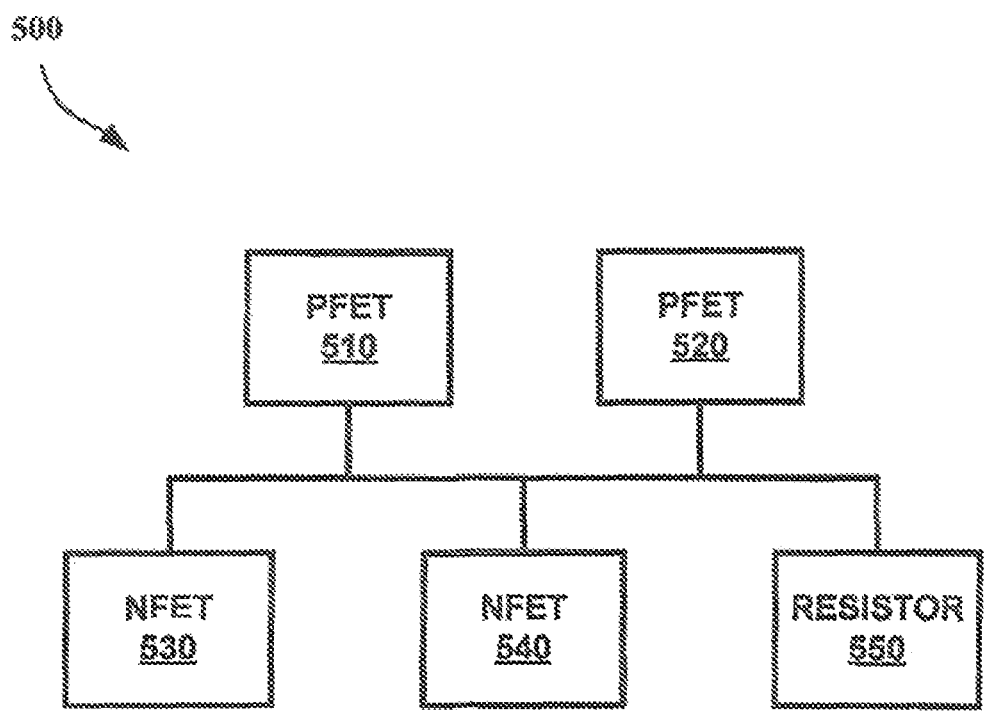
FIG. 5 illustrates an example for detecting floating nodes by combining multiple devices on a single node. Similar type methods may also be used to analyze contention problems.

FIG. 5 illustrates an example for detecting floating nodes by combining multiple devices on a single node. Similar type methods may also be used to analyze contention problems.

FIG. 5 illustrates an example (500) for detecting floating nets by combining multiple devices on a single net, the general principles of which can also be applied to the present invention. The example (500) shows Net (505) coupled to a PFET (510), a PFET (520), an NFET (530), an NFET (540), and a resistor (550). In one embodiment, when the floating gate detection software (net analyzer (100)) analyzes a net, the net analyzer (100) considers combinations of several devices based on a lookup table and based on a type of device coupled to the net. For example, if the net analyzer (100) determines if Net (505) is high, then an expression may be used such as: PFET 510=1|PFET 520=1|Resistor 550=1, as any PFET or resistor may pull high. In this situation, the net analyzer (100) does not use expressions for the NFETs (530-540), as the NFET may only pull the Net (505) to 0, and the net analyzer (100) is "optimistic" by looking at every combination where the Net (505) may be high. Additionally, by not including the NFETs, the net analyzer (100) has fewer expressions in the equation.

Figure 6:
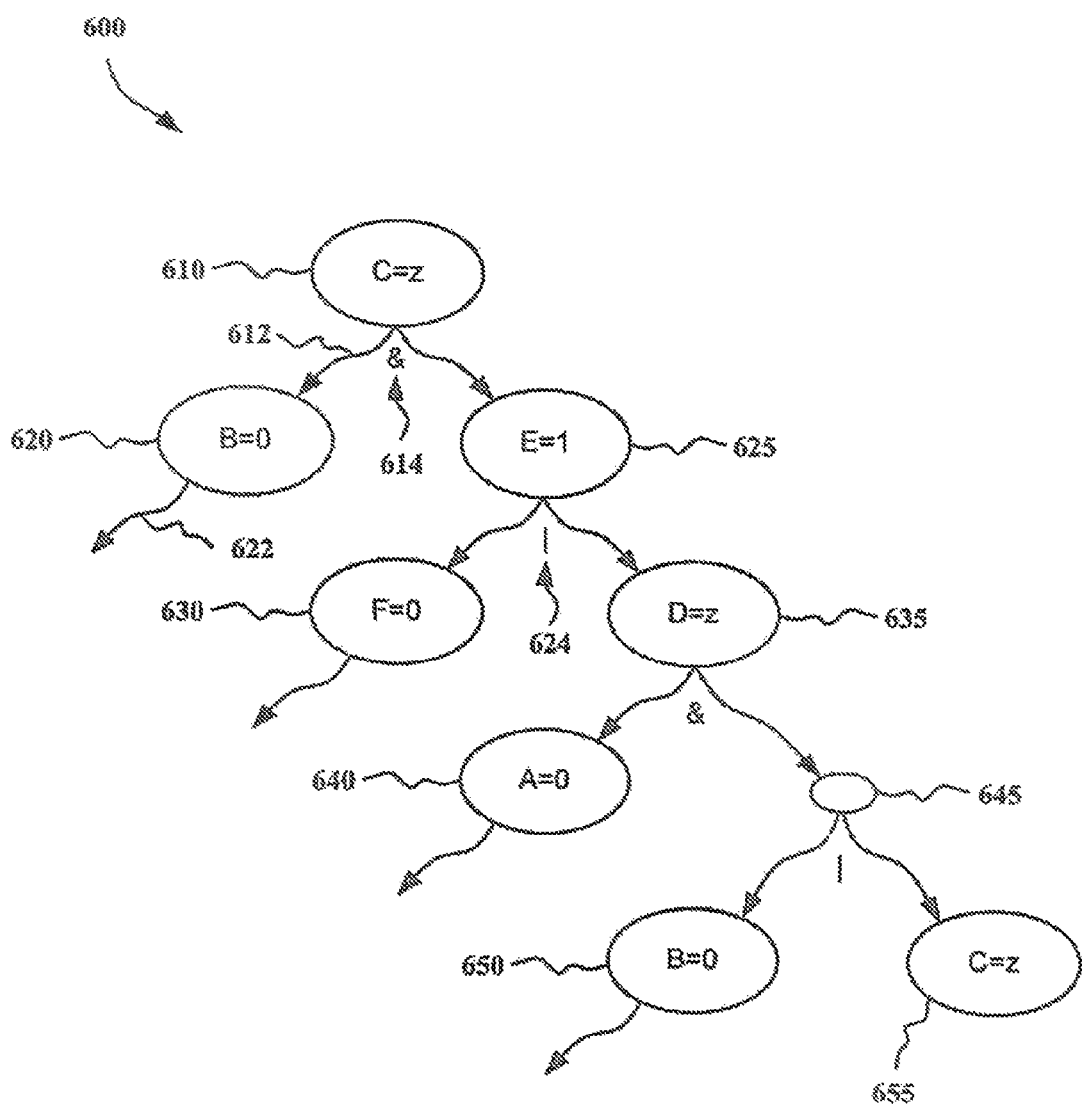
FIG. 6 is a diagram of an expanding logic tree method for detecting floating nodes. Similar type expanding logic trees may also be used to analyze contention problems.

FIG. 6 is a diagram of a tree of a method for detecting floating nodes. Similar type trees may also be used to analyze contention problems.

FIG. 6 is a diagram of a tree (600) (e.g. expanding logic tree) of a method for detecting floating nets, and this basic type of method may also be used for the present contention art as well. As illustrated, the tree (600) comprises nodes, such as node (610), relationships, such as relationship (612), and expressions, such as expression (614). The tree (600) is used to illustrate logic expressions, node relationships, and the like. The relationships couple two or more nodes. For example, the relationship (612) couples node (610) and node (625). The expressions are logic dispositions. The tree (600) expands from node (610), a top node, downward as the net analyzer (100) resolves a hypothesis. The top node, the node (610), of the tree (600) contains a hypothesis. The hypothesis is "C=z", that is, "Does net C float?" As the net analyzer (100) progresses down the tree (600), the hypothesis may be either proved or disproved.

Figure 7:
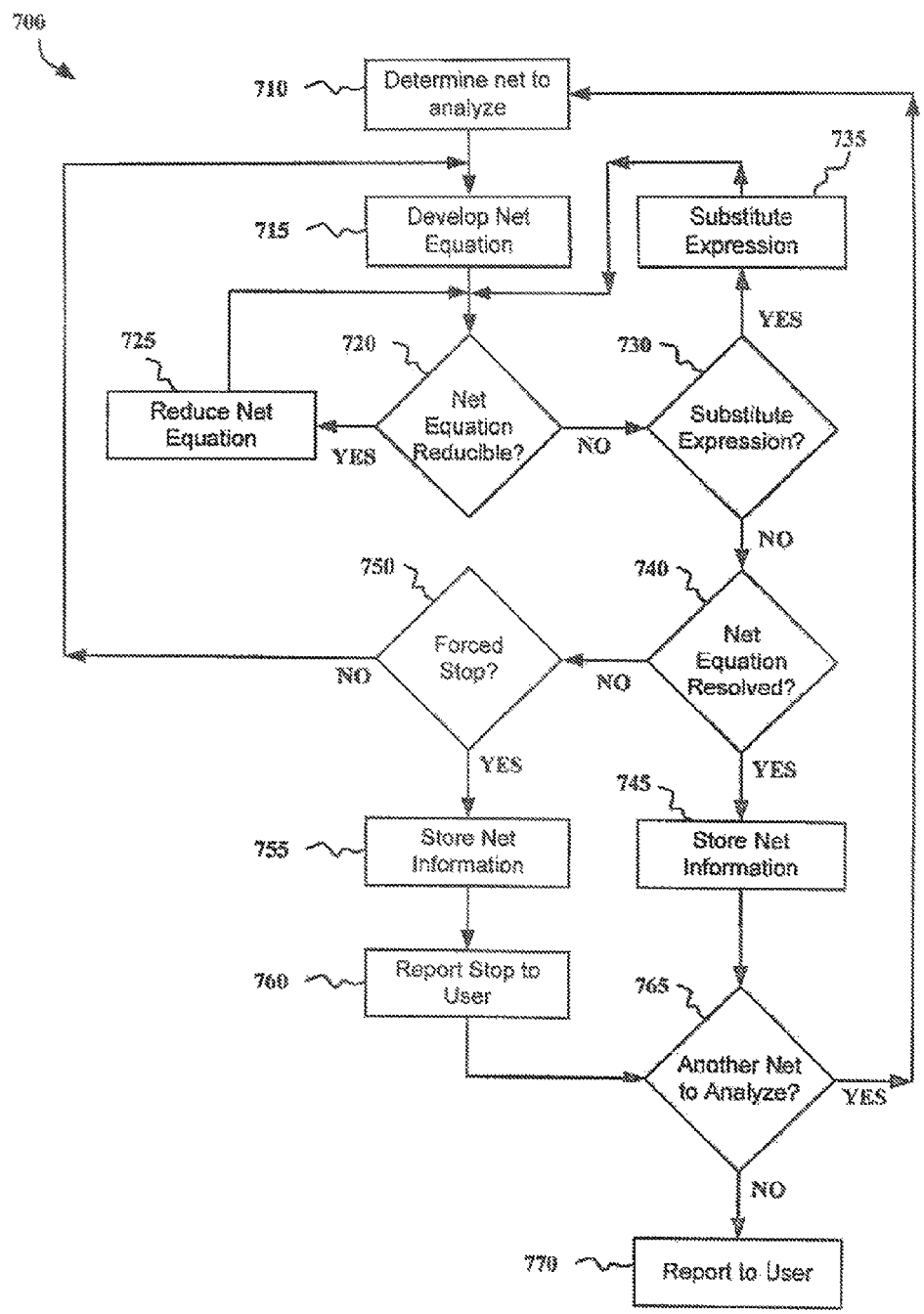
FIG. 7 is a logic diagram of a method for detecting floating nodes. Similar type methods may also be used to analyze contention problems.

FIG. 7 is a logic diagram of a method for detecting floating nodes. Similar type methods may also be used to analyze contention problems.

More specifically, FIG. 7 is a logic diagram of a method for detecting floating nets. At (710), the net analyzer (100) determines a net to analyze. The determination may be based on suspect nodes, as discussed herein, methodical, or user defined, such as looking at a particular section of a circuit. After the net analyzer determines the net to analyzer, at (715), the net analyzer (100) develops a net equation to represent a state based on a hypothesis, as discussed herein.

At (720), the net analyzer (100) determines if the net equation is reducible, as discussed herein. If the net equation is reducible, then the net equation is reduced at (725) and loops back to check if the net equation may be reduced again at (720). If the net equation is not reducible, at this time, the net analyzer (100) determines, at (730), if a substitute expression may be made, as discussed herein. If a substitute expression may be made, the net analyzer substitutes an expression at (735). If the substitution is made, the net analyzer (100) checks again to determine if the net equation is reducible at (720).

Figure 8:
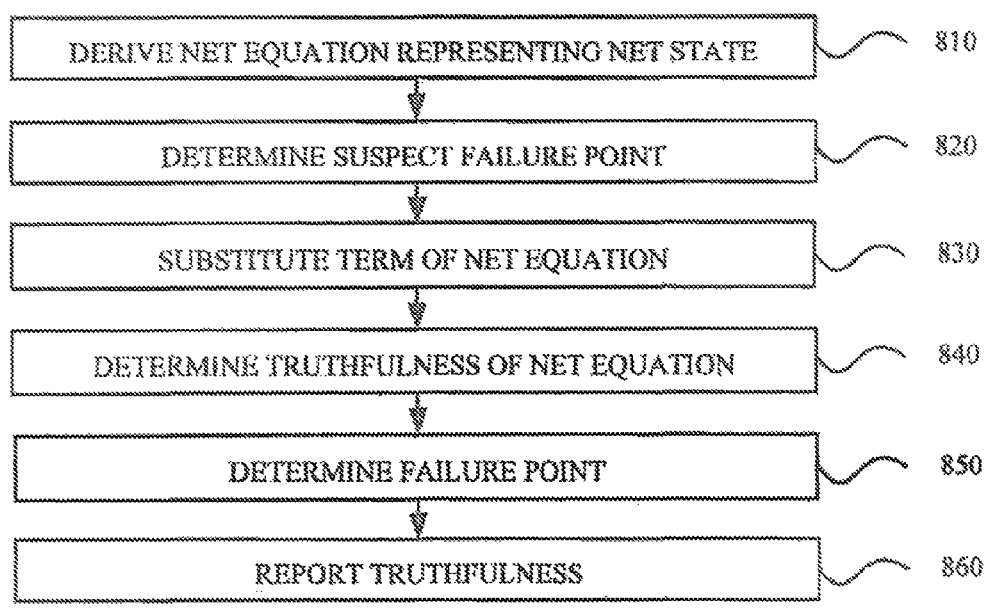
FIG. 8 is a flow chart of a method for detecting floating nodes. Similar type flow charts may be used to detect contention problems.

FIG. 8 is a flow chart of a method for detecting floating nodes. Similar type flow charts may be used to detect contention problems.

More specifically, although FIG. 8 shows a flow chart of a method for detecting floating nets, the flow chart for the present contention invention software can be quite similar. In step (810) the net analyzer (100) derives a net equation representing a net state of a circuit net. The net equation is derived from at least one other net state, as discussed herein and in more detail in application Ser. No. 13/345,721 and the other previously discussed citations.

In various embodiments, the net analyzer (100) determines a suspect failure point (e.g. the probable cause of the floating gate) prior to determining the truth status of the net equation. The suspect failure point (or probable cause) is determined based on device configuration.

Figure 9:
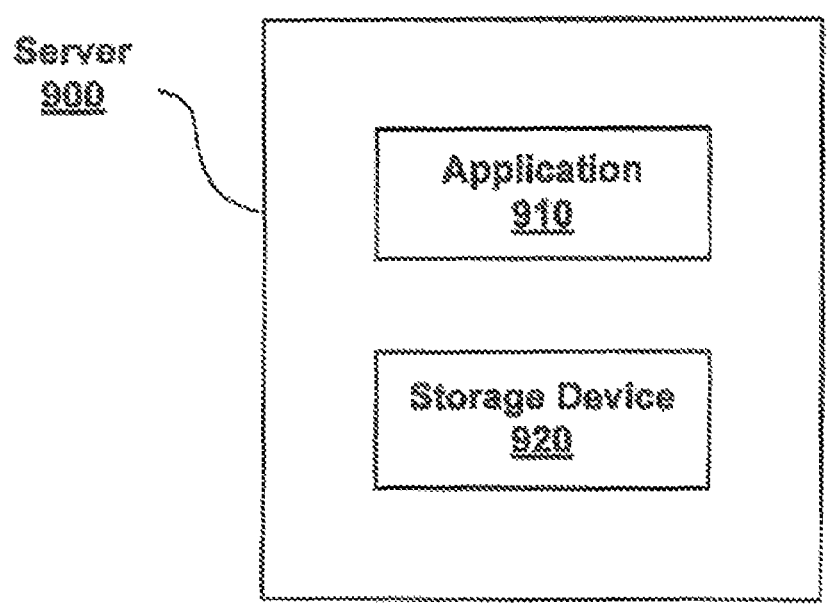
FIG. 9 illustrates a server or other computer type device, upon which software to detect either floating gates or to detect contention problems, may be implemented.

FIG. 9 illustrates a server or other computer type device, upon which embodiments of either the software to screen for floating gates, or the invention's software to detect contention problems, may be implemented.

FIG. 9 illustrates a computer server (900). The server (900) will generally consist of at least one computer processor, memory, and other devices such as network interfaces, operating system software, I/O interfaces, and the like. As illustrated, the server (900) comprises a software application (910) (such as the invention's circuit analysis software), and a storage device (920). The application (910) is configured to run on the server, and configured to perform the functions of the net analyzer 100. The storage device (920) may be configured to store information, such as net states, net configurations, and/or any other information.

In various embodiments, the server (900) contains a computer readable medium having embodied thereon a program (e.g. the invention's contention analysis software), the program being executable by a computing device for performing the invention's methods. The program is configured to receive circuit configuration information from a user; and return net state information to the user.

Various alternatives, modifications, and equivalents may also be used. For example, the net analyzer (100) may operate remotely or be accessed via a network. In another example, the net analyzer (100) may access multiple CPU located on different computers to perform net state analysis.

Figure 10:
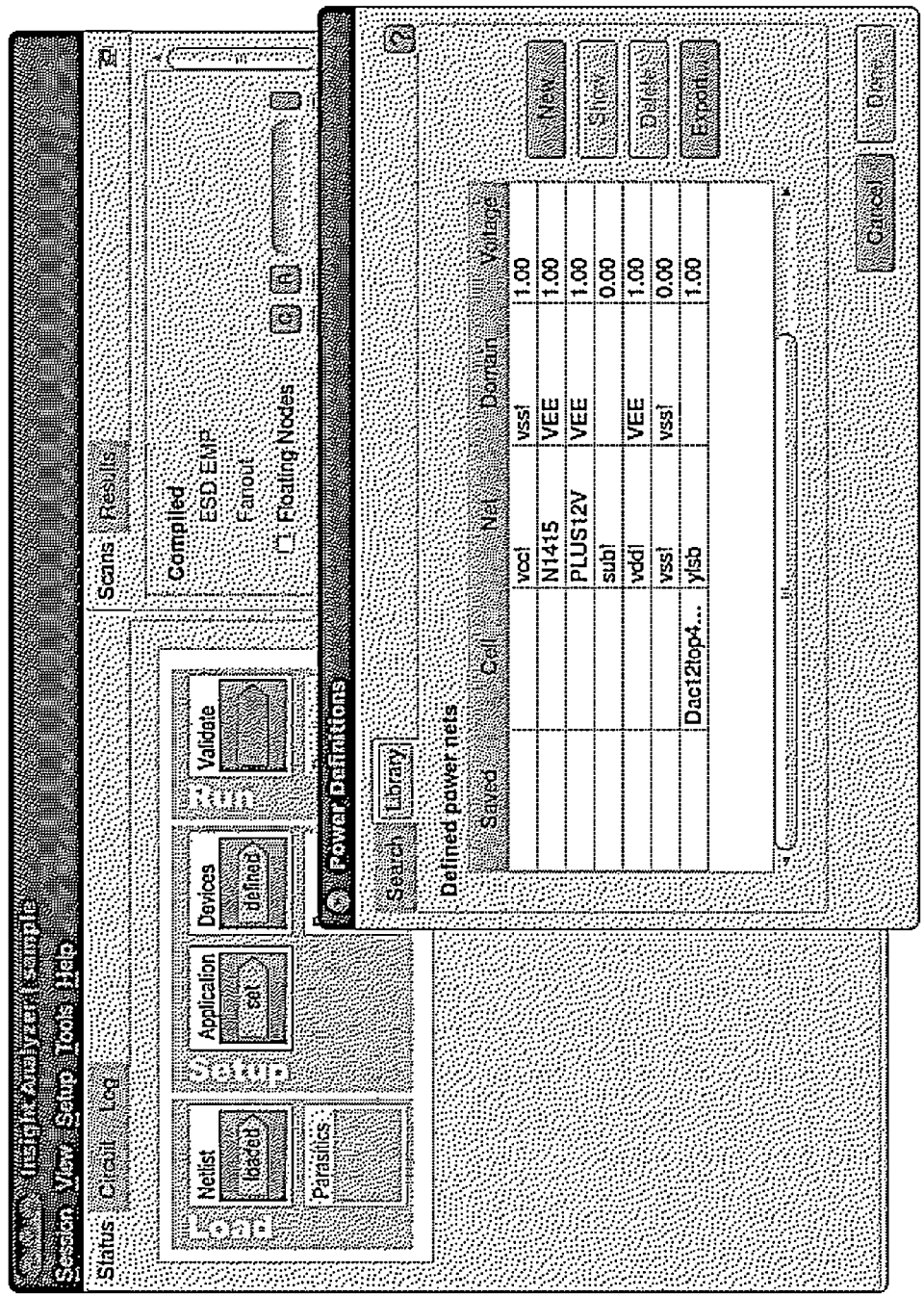
FIG. 10 shows a screenshot showing the floating gate (or node) detection software in operation for floating node detection. Here the user is entering in the analysis parameters for the particular circuit of interest. Similar type software may also be used to enter in the analysis parameters to detect contention in the particular circuit of interest.

FIG. 10 shows a screenshot showing an example of the floating gate detection software in operation for floating node detection. Here the user is entering in the analysis parameters for the particular circuit of interest. Similar type software may also be used to enter in the analysis parameters to detect contention in the particular circuit of interest.

FIG. 10 shows the floating gate detection software's setup phase. Here the user is manually entering in the definitions of the circuit's power supply nets. In alternative embodiments, discussed in more detail in parent application Ser. No. 13/401,704, the contents of which are incorporated herein by reference, the software may automatically identify the power and ground nets. However in this screenshot, the user is manually entering in the names of the power nets, as well as the voltages these power nets hold during normal circuit operation.

Figure 11:
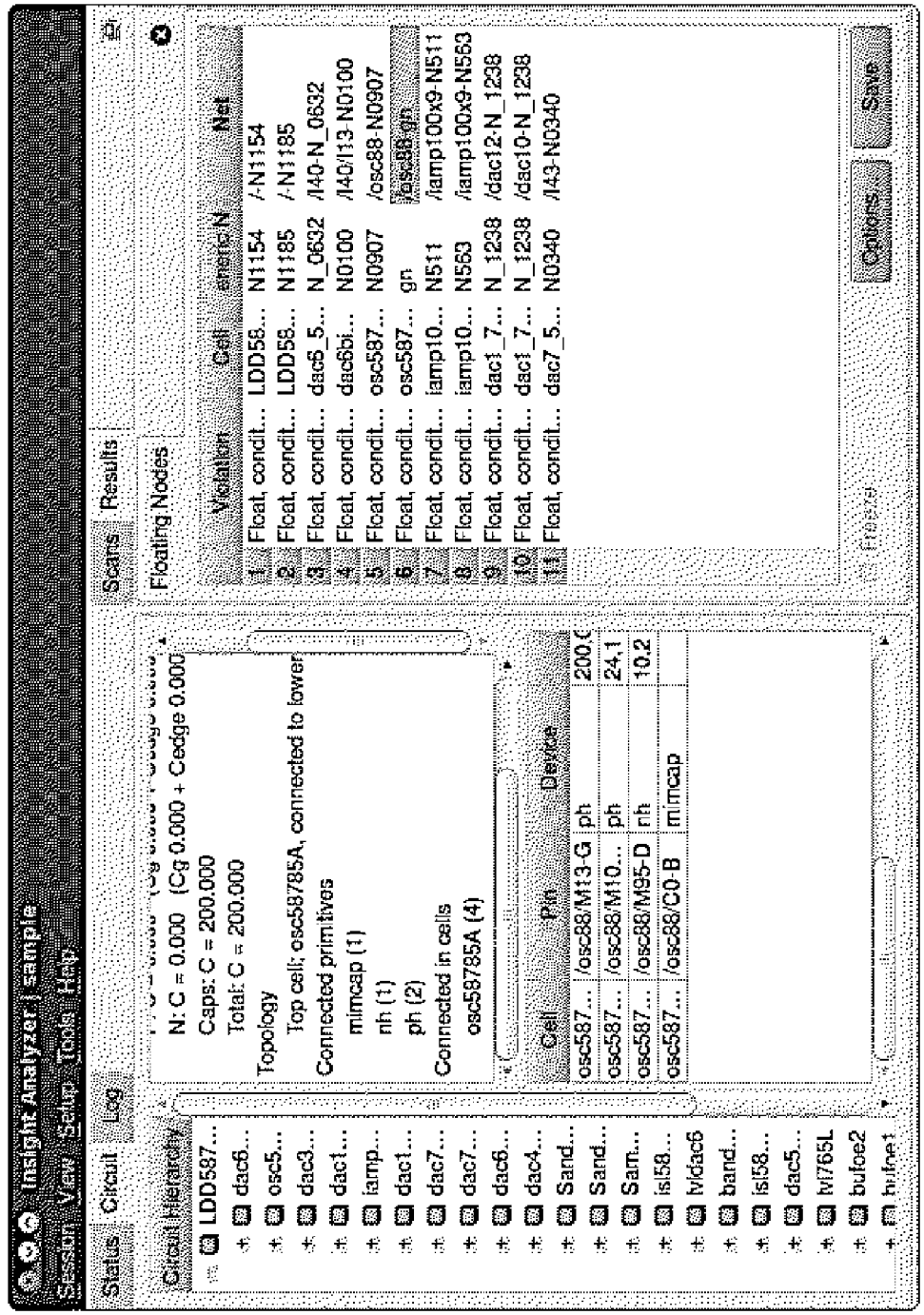
FIG. 11 shows a screenshot showing the floating gate detection software in operation. Here a probable floating gate node is being reported. In other embodiments, probable digital drivers with contention issues may also be reported with either similar or different type software interfaces.

FIG. 11 shows a screenshot showing the floating gate detection software in operation. Here a probable floating gate node is being reported. In other embodiments, probable digital drivers with contention issues may also be reported with either similar or different type software interfaces.

In FIG. 11, the circuit analysis has been completed, and the reported floating gate(s) are shown in a tabular list format. To obtain more information about a particular floating gate of interest, the user can click any one of the floating gates (line items), and see more details of that specific floating gate. This information can include items such as the floating gate's location or point in the overall circuit, the full path used to reach that net or device, and so on. Similar type information can also be reported for digital drivers that are shown to be in contention.

Figure 12:
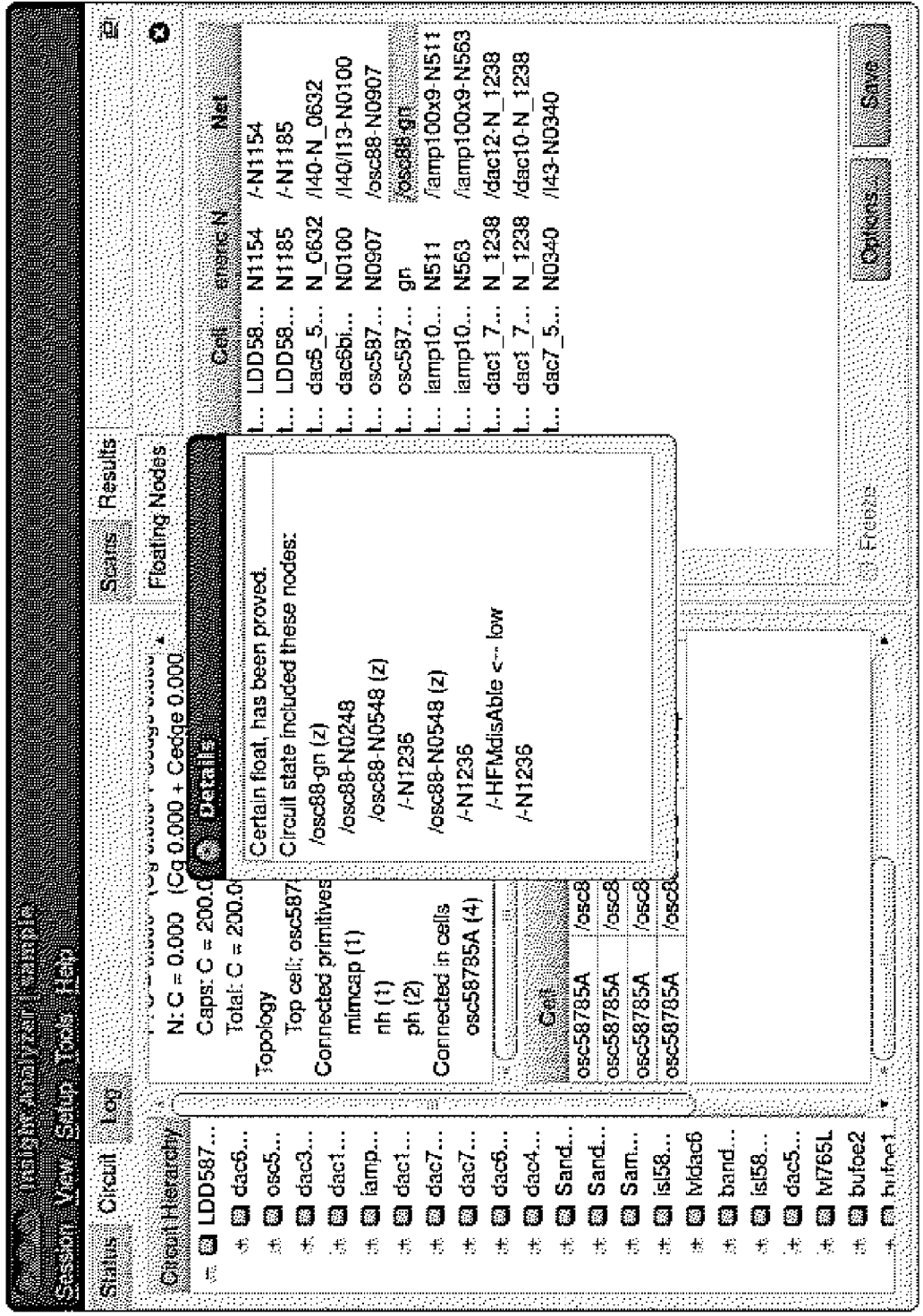
FIG. 12 shows a screenshot showing the floating gate detection software in operation. Here a probable cause for a floating gate node is being reported. In other embodiments, probable digital drivers with contention issues may also be reported with either similar or different type software interfaces.

FIG. 12 shows a screenshot showing the floating gate detection software in operation. Here a probable cause for a floating gate node is being reported. In other embodiments, probable digital drivers with contention issues may also be reported with either similar or different type software interfaces.

Specifically, FIG. 12 provides additional information as to what made this particular gate a floating gate. Here the user has clicked on a floating gate of interest (see FIG. 11 above), and now sees the reduced set of nets (i.e. zooming in to the most relevant nets) that relate to that selected floating gate of interest. This additional information can include nearby connections, as well as nets that either A) drive the signal to the floating gate and/or B) control the on/off state of other that then in turn drive signal to the floating gate. The same type of methods can also be used for the present contention detection art.

Going forward, FIG. 13-20 focus more specifically on the unique aspects of the heuristics behind the present automated contention detection art.

Figure 13:
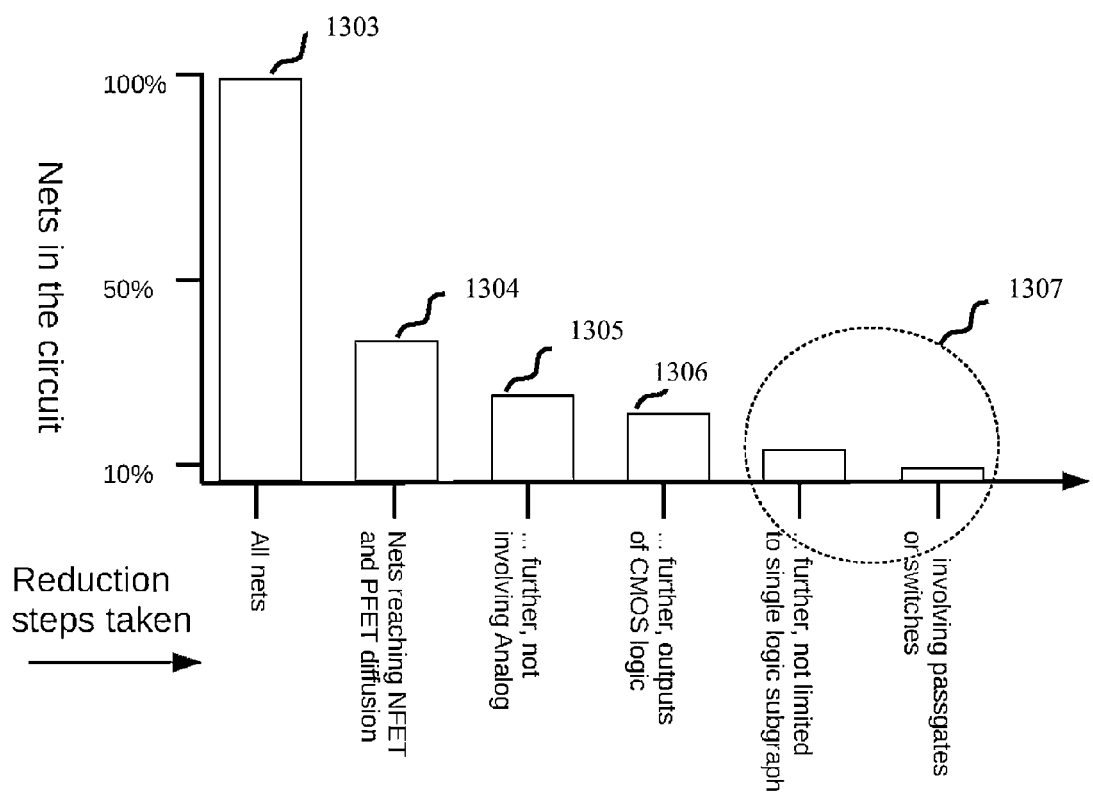
FIG. 13 illustrates that not all nets need to be analyzed for contention. In some embodiments, only a subset of nets need be analyzed, thus speeding up analysis time and reducing the chance of unwanted false positives.

FIG. 13 illustrates that not all nets need to be analyzed for contention. In some embodiments, only a subset of nets need be analyzed, thus both speeding up analysis time and reducing the chance of unwanted false positives.

Generally, and in a preferred embodiment, the speed of the analysis can be improved, and fewer uninteresting false positive results will be generated, if the various nets to test for contention are first filtered from the overall circuit (much bigger set of nets, not necessary to test). Put alternatively, the contention software can be directed not to bother to analyze these portions of the circuit. Some of the various possible filtering steps are shown in FIG. 13.

FIG. 13 shows that although all nets (1303) in the larger circuit may be investigated for reduction/elimination, often multiple reduction/elimination steps may be used. In this example, a smaller subset (1304) of nets are found to connect directly to, or have DC resistive paths, to both NFET and PFET source/drain pins, which is one important contention criteria.

An even smaller subset (1305), derived from (1304), of nets are also not connected to analog circuit portions. Since analyzing analog circuit portions generally generates too many contention false positives, it is often useful to further exclude analog circuits as well.

An even smaller subset (1306), derived from (1305), of nets are found to be outputs of CMOS digital logic, which helps further find the most relevant contention cases.

Finally, a further reduced subset (1307), derived from (1306), of nets are found to be either (A) spanning across multiple logic circuit portions or (B) connected to the signal paths of switch components. Design errors frequently occur in these regions, and thus this subset (1307) is often a particularly important "go to" spot for contention checking Thus the nets in subset (1307) are, by far, the most likely to exhibit the most significant (from a design standpoint) cases of contention if contention exists anywhere in the whole circuit (1303).

However not all reduction/elimination steps need to be done for any particular analysis. In some embodiments, it may be useful to analyze more of the circuit to identify more borderline undesirable contention situations. Some of these various reduction/elimination steps will be discussed in more detail later in the specification.

Thus it is often useful in the automated contention analysis to direct the software to select those nets in said electronic circuit design that connect either directly, or by DC resistive paths, to both PFET and NFET source drain pins.

Similarly, it is often also useful in the automated contention analysis to direct the software to further select those nets that are determined to have CMOS digital logic outputs, but not connected to analog circuit portions of said electronic circuit design. For these purposes, the software may be configured to recognize that such analog circuit portions of the electronic circuit design comprise circuit portions with at least one of diodes, diode-tied FETS, capacitors, capacitor-tied FETs, or bipolar transistors.

For the previously discussed reasons, it is also often useful in the automated contention analysis to direct the software to further give higher analysis priority to nets that either span across multiple logic circuit portions of the electronic circuit design, or which are connected to signal paths of switch components of the electronic circuit. It is also often useful to configure the software to reporting the contention results to a user in a manner that gives higher priority to nets that either span across multiple logic circuit portions of said electronic circuit design, or which are connected to signal paths of switch components of said electronic circuit.

Since the heuristics of contention detection differ substantially from the earlier floating gate art, these contention detection heuristics are now discussed in more detail.

In some embodiments, it is useful to configure the contention detection software to recognize that digital drivers comprise PFET and NFET devices or switches comprised of a combination of PFET and NFET devices.

In some embodiments, it is also useful to configure the contention detection software to recognize that the digital drivers can be determined by automatically tracing NFET pull down paths to ground nets, and PFET pull up paths to power nets. The software can also determine when a gating signal controlling the NFET pull down paths also is a gating signal controlling the PFET pull up paths.

Figure 14:
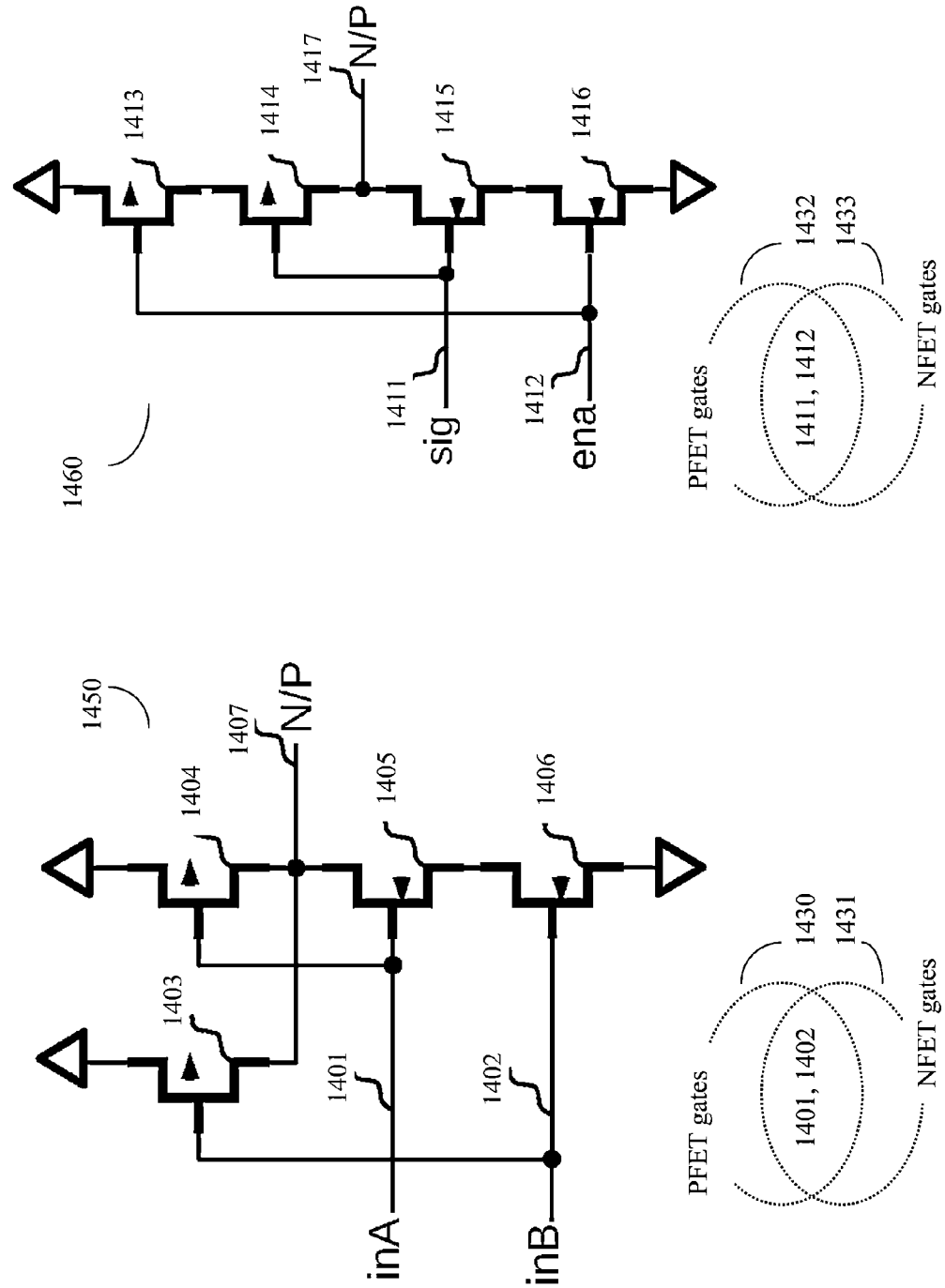
FIG. 14 illustrates an example of how the system may automatically find CMOS digital circuit portions by tracing NFET and PFET source and drain connections until reaching power supply nets and ground nets.

FIG. 14 illustrates an example of how the system may automatically find CMOS digital circuit portions by tracing NFET and PFET source and drain connections until reaching power supply nets and ground nets.

In this example, consider circuit (1450), and the general problem of finding CMOS digital circuit portions. Here the software can be configured to determine that Net (1407) is an output, as it has both NFET (1405) and PFET (1404) source/drain connections. To ascertain that net (1407) is, indeed, a CMOS digital output net, the software may take the following steps:

The software may trace outward through encountered PFETs (1404) and (1403) until reaching their positive power supply net, and trace outward through encountered NFETs (1405) and (1406) until reaching their ground net. During this tracing, the software can also gather the list of nets connected to gates of the encountered NFETs and PFETs. The software can then compare the PFET gate nets (1401) & (1402) against the NFET gate nets (1401) & (1402).

In this example, the software would determine that set (1430) of PFET gate nets is a complete overlap of the set (1431) of NFET gate nets. Given this complete overlap of PFET and NFET gate nets between sets (1430) & (1431), the software can then conclude that circuit portion 1450 consists of CMOS digital logic.

Example circuit portion (1460) is another form of CMOS digital topology, however in this case the logic output 1417 has a third state of "off", in addition to the logic states of "high" and "low".

In this example, the software can still identify the circuit portion type, because the output net (1417) can be identified by its connections to source/drain pins of both NFET and PFET types. Then from (1417), the software can explore the circuit outward through PFETs (1414) & (1413), while the gate nets (1411) & (1412) of said PFETs are noted. Similarly, from (1417), the circuit is explored through NFETs (1415) & (1416), while the gate nets (1411) & (1412) of said NFETs are noted. Finally, the software can make a comparison between the set (1432) of PFET gate nets and set (1433) of NFET gate nets. The software will again find that the two sets (1432) & (1433) are complete overlaps of each other, and, the software can then conclude that the circuit portion (1460) also consists of CMOS digital logic.

Figure 15:
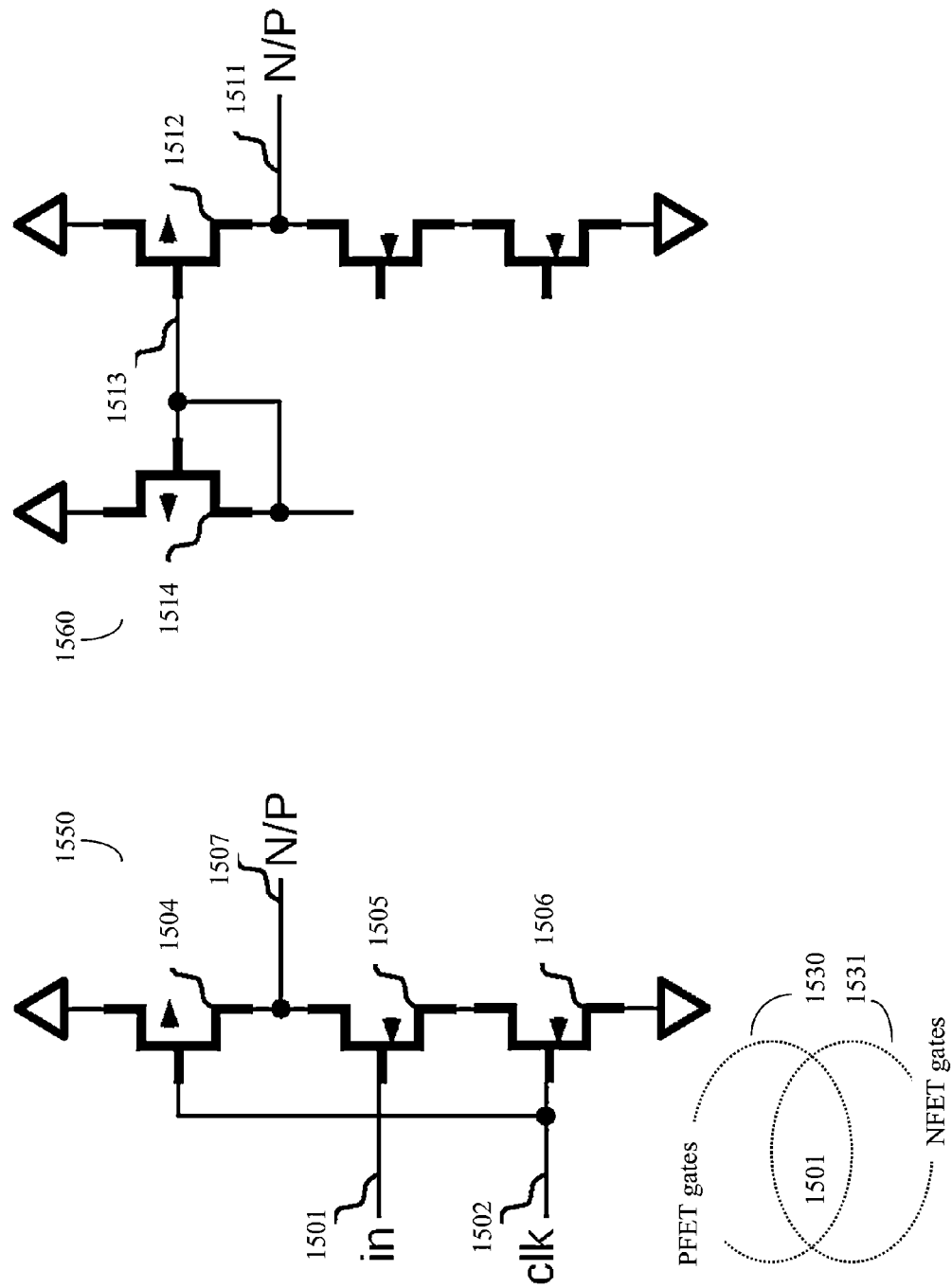
FIG. 15 illustrates an example of how the system may automatically rule out analyzing certain circuit portions, such as analog portions or dynamic logic portions, where contention analysis may be less appropriate.

FIG. 15 illustrates an example of how the system may automatically rule out analyzing other certain circuit portions, such as analog portions or dynamic logic portions, where contention analysis may be less appropriate.

Circuit portion (1550), shown in FIG. 15, has many characteristics of CMOS logic as previously described in FIG. 14, however there is one key difference that would cause (1550) to be rejected by the invention's software as in fact not being CMOS logic. This difference is that the sets (1530) & (1531) of PFET and NFET gates nets are not complete overlaps of each other. Specifically set (1530) of PFET gate nets is a subset of set (1531) NFET gate nets.

This therefore indicates that the circuit portion 1550 is not CMOS logic. In fact, circuit portion 1550 is instead an example of dynamic logic, where contention testing is often less useful as well. Thus in many embodiments, the software may be configured to reject (not analyze) this type of dynamic logic circuit as well.

Thus circuit portion (1560) is another example that may at first seem to be CMOS logic, but which can then be automatically ruled out by the invention's software after closer inspection. In this case, while exploring the PFET (1512) as a path to power supply, the software encounters a gate net (1513). The connections on gate net (1513) include diode-tied PFET (1514). The software can be configured to recognize that this "pollutes" the concept of CMOS digital logic (e.g. if encounter diode-tied PFET, then CMOS digital logic=false). Thus with this software configuration, the presence of diode (1514) is enough to rule out circuit portion (1560) as being a possible CMOS digital logic. Here the invention's software may be configured to automatically determine that the whole of (1560) is considered to be analog, and thus the contention analysis software will often automatically exclude (1560) from contention analysis as well.

Again, this optional step is done because (1560) (and also 1550) because contention is often not an issue in analog circuits, and usually is also not an issue in dynamic logic circuits either. Thus often a contention analysis here will have little value.

It should be noted that these methods require that the analysis software understand which circuit nets are power nets and which circuit nets are ground nets. In some embodiments, these power and ground nets may be defined prior to the time that analysis starts, and indeed may initially part of the computer readable electronic circuit design, or manually entered in by the user, as was shown in the floating gate analysis example in FIG. 10.

However it is not required that the power and ground nets be defined prior to the analysis. In some embodiments, the methods of parent Ser. No. 13/401,704, "Automated Identification of Power and Ground Nets in an Integrated Circuit Netlist", the contents of which are incorporated herein by reference, may be used to automatically analyze the electronic circuit design and automatically determine the various power and ground nets.

Briefly, the methods of Ser. No. 13/401,704 can be used to automatically determine, without prior information, those nets that are statistically likely to be power or ground nets based on a statistical analysis. The methods of Ser. No. 13/401,704 also operate by using at least one computer processor, software, and memory to analyze the nets from a larger electronic circuit design netlist.

However in this case for each analyzed net the software determines the electrical properties of each device or device terminal that is coupled to the analyzed net, and sorts the electrical properties for each device or device terminal into a series of bins, thereby creating a mathematical description of overall electrical properties of various devices that are coupled to the analyzed net.

The software then compares this mathematical description with at least one preset mathematical description of a power net or a ground net. If this mathematical description falls within at least one preset mathematical description of a power net or a ground net, then at the power and ground analysis software can at least provisionally determine that the analyzed net is a power net or a ground net, and store a result of this determining in memory for later use (such as use for contention analysis purposes, or floating gate analysis purposes).

Here often the devices coupled to the analyzed net can include PMOS transistors, NMOS transistors, diodes, and capacitors, and the bins comprise a total number of device terminals coupled to the analyzed net. This can include a PMOS transistor bulk terminal bin, a PMOS transistor source and drain terminal bin, a NMOS transistor bulk terminal bin, a NMOS transistor source and drain terminal bin, a diode cathode bin, a diode anode bin, and a capacitor terminal bin. Here, often at least one preset mathematical description of a power net or a ground net can be obtained by counting capacitors. Specifically, the software can recognize that a capacitor bin (indicating that the analyzed net is coupled to a capacitor) has a capacitor count that is both greater than a preset percentage of the total number of device terminals coupled to the analyzed net (e.g. capacitor count greater than x %), and is also greater than one. Other criteria also may be used as well.

Analysis at the Transfer Switch Level

In some embodiments, rather than always examining the circuit at the individual PFET and NFET device level, it is often useful to go to a slightly higher level (e.g. transfer switch level) for the contention analysis.

Figure 16:
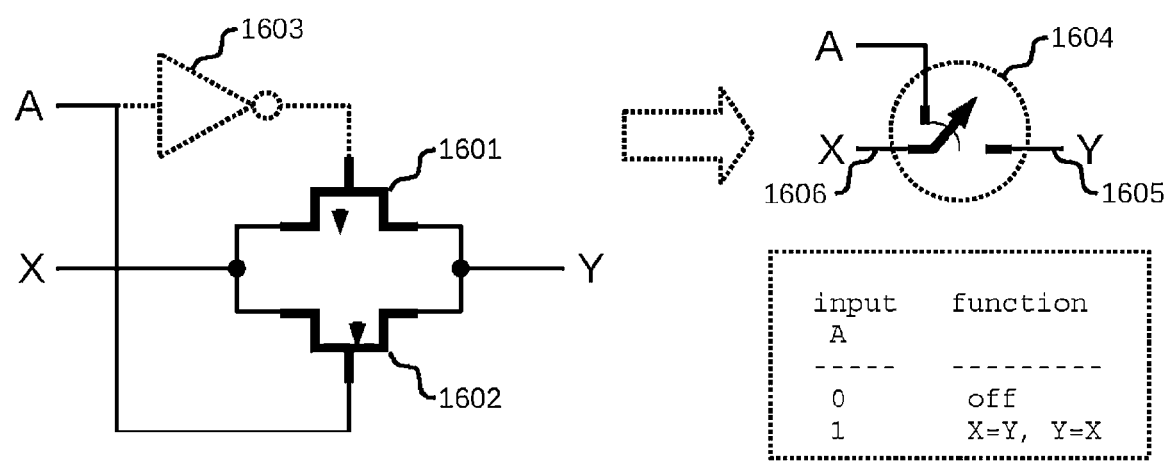
FIG. 16 shows a frequent digital circuit method of switching digital signals through "transfer switches" or "passgates" formed by PFET and NFET devices connected with a distinctive topology. In some embodiments, the invention's software may be configured to recognize such transfer switches/passgates, and simplify the logical tree contention analysis process by analyzing at the transfer switch/pass gate level, thus requiring fewer nodes in the logical tree analysis.

FIG. 16 shows a frequent digital circuit method of switching digital signals through "transfer switches" or "passgates" formed by PFET and NFET devices connected with a distinctive topology. In some embodiments, the invention's software may be configured to recognize such transfer switches/passgates, and simplify the logical tree contention analysis process by analyzing at the transfer switch/pass gate level, thus requiring fewer nodes in the logical tree analysis.

Contention is most commonly suspected within digital circuits (rather than analog), in areas where digital signals are switched through transfer switches, sometimes referred to as passgates.

In some embodiments, the invention's software may simplify the analysis of transfer switches to improve processing efficiency. To do this, the software will often first identify transfer switches by their topological characteristics. In particular, for transfer switches, as shown in FIG. 16, their PFET (1601) and NFET (1602) components are typically connected with source and drain terminals in parallel, and gates connected to provide control, usually through a digital inverter such as (1603). The software can be configured to recognize this type of topology.

When this type of transfer switch configuration is detected, the contention analysis software can simplify or reduce the logical consideration of FETs (1601) and (1602), and inverter (1603) to a single element (1604), representing a transfer switch. The function of the transfer switch (1604) is to either make or break a DC connection between two terminals (1605) and (1606). This simplified transfer switch (1604), when used in a decision tree, occupies fewer logical nodes than would have been occupied by the more complex parts (1601), (1602), and (1603), thus reducing analysis complexity.

This transfer switch approach is highly useful and is also employed in FIG. 17 and FIG. 18 below.

Figure 17:
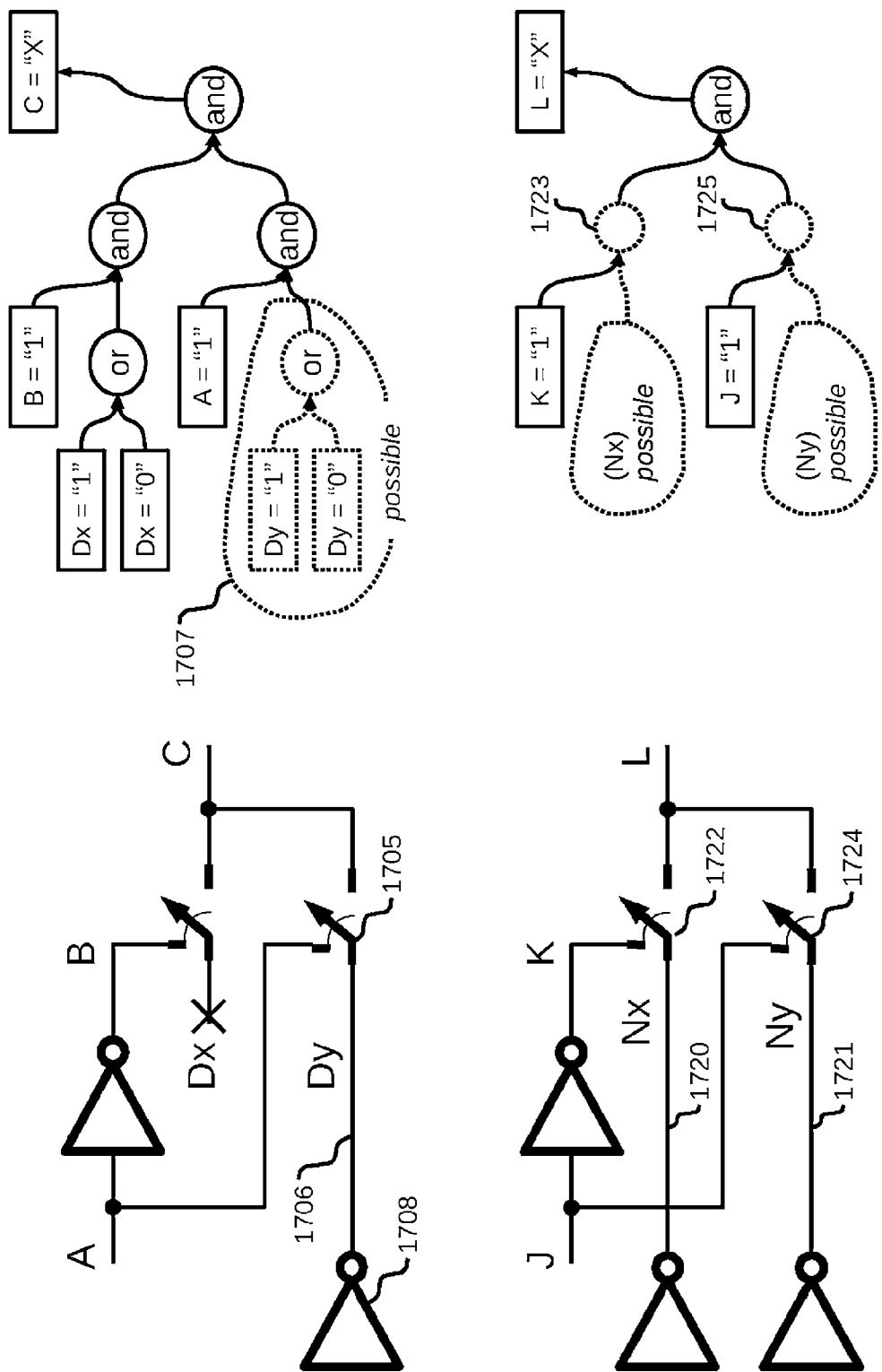
FIG. 17 shows an example of a logical tree contention analysis of a circuit, here done at the transfer switch/passgate level.

FIG. 17, which focuses on one of the most important or serious types of contention, also shows an example of a logical tree contention analysis of a circuit, here done at the transfer switch/passgate level.

In contrast to FIG. 3B earlier, which gave a more general definition of contention, FIG. 17 is best viewed as a "poster child" for a type of contention that the invention can detect that is useful and important to report to circuit design and debugging engineers.

As previously discussed, the contention analysis software will often be configured so that if the expanding logic tree representation of a previous level of predecessor circuit portions determines that two or more digital drivers in the predecessor circuit have outputs connected together (thus forming a short circuit), then the software will be configured to further determine that this predecessor circuit portion represents a potential contention configuration.

Towards that end, it is often also useful to further identify transfer switches in the previous level of predecessor circuit portions, and simplifying the expanding logic tree representation by avoiding further consideration of digital signals driven through the transfer switches, and instead finding conditions where the digital signals are shorted together.

To expand on these ideas, note that contention is commonly suspected in circuits that send digital signals through transfer switches, due to (A) the risk that the outputs of multiple digital drivers may be inadvertently connected together by turning on a DC path of transfer switches between them, and (B) the prevalence of these transfer switches in digital designs.

Thus this is a common source of trouble with contention. Essentially, the digital drivers would be shorted together through transfer switches, which is a bad thing. Indeed, it is commonly accepted that digital drivers must never have their outputs connected together. This sort of engineering rule can be built into the contention analysis software as well.

When constructing a decision tree for a circuit that uses transfer switches, there might arise the assumption that nodes in the decision tree must account for all factors of the transfer switches. It might also be assumed that the decision tree nodes must represent both the controls of the transfer switches, and the signals passing through the transfer switches. However, at least one aspect of the invention goes against these normal assumptions, and instead is based on the insight that in fact these factors can be reduced. In fact under some conditions, the software can basically ignore the signal paths, and instead just focus on the control paths. Doing so, as shown in FIG. 17, results in increased software processing efficiency, while still producing accurate results.

To illustrate, consider FIG. 17. Note that the decisions made regarding transfer switch (1705) depend partly on the state of net Dy (1706). Initially, the state of net Dy (1706) may be represented by multiple nodes (1707) in the decision tree. The multiple nodes (1707) in the decision tree are both possible, because net Dy (1706) is driven by inverter (1708), which is a digital driver capable of issuing of these states.

However note that nets (1720) and (1721) have both been replaced by simplified nodes in the corresponding decision tree. Transfer switch (1722) is represented by the simplified node (1723), as an expression that does not depend on net Nx (1720) in any state. Similarly, Transfer switch (1724) is represented by the simplified node (1725), as an expression that does not depend on net Ny (1721) in any state.

Because it is commonly accepted that digital drivers must never have their outputs connected together, it is, therefore, acceptable (e.g. an acceptable simplification) to remove nets (1720) and (1721) from the decision tree, and reduce the appropriate nodes to expressions simply of nets J and K (1723 and 1725), the conditions by which nets (1720) and (1721) would be connected together.

Thus, in some embodiments of the invention a decision tree (expanding logic tree) involving transfer switches may be simplified by avoiding consideration of the digital signals that are driven through the transfer switches. In such cases, the decision tree can be optimized to find conditions by which the digital signals are shorted together, while avoiding consideration of what states those digital signals might be in.

Figure 18:
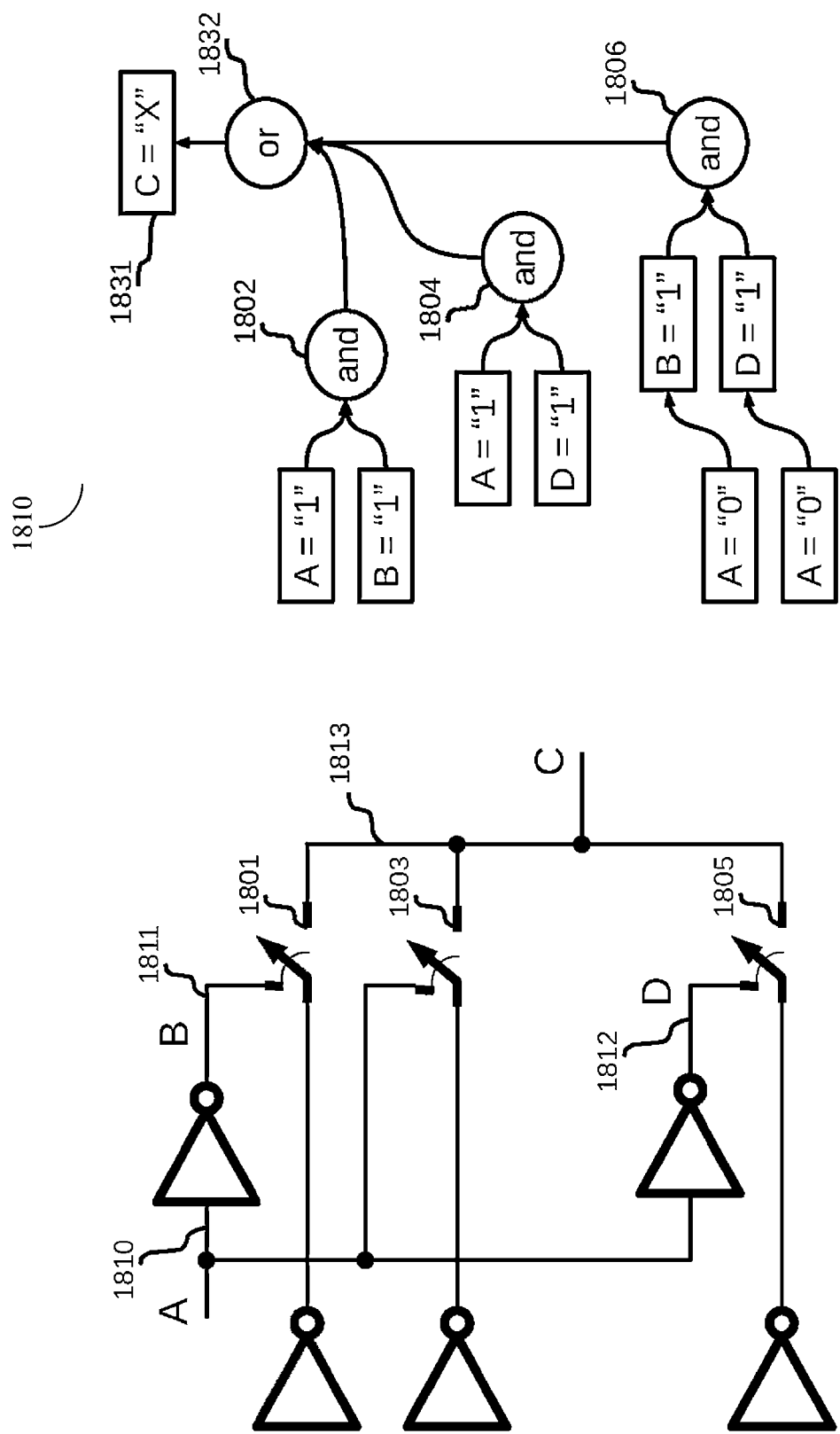
FIG. 18 shows a further example of a logical tree contention analysis of a circuit, here again done at the transfer switch/passgate level.

FIG. 18 shows a further example of a logical tree contention analysis of a circuit, here again done at the transfer switch/passgate level.

In FIG. 18, the hypothesis that net (1830) will have contention is represented by decision tree (1810) node (1831). This hypothesis relies on the "or" term (1832), which represents combinations of transfer switches (1801), (1803), and (1805) turning on simultaneously.

Node (1802) represents transfer switches (1801) and (1803) turning on together, based on the controls of net (1810) and (1811). Node (1804) represents transfer switches (1803) and (1805) turning on together. Node (1806) represents transfer switches (1801) and (1805) turning on together.

It is node (1806) that can be logically satisfied; Net (1810) going low leads to nets (1811) and (1812) going high, which then satisfy (make 'true') node (1806). The logical 'true' carries up to "or" term (1832), and, being logically sufficient, carries up further to reach the hypothesis node (1831), thereby proving the whole case for net (1830) as reaching contention.

Thus to summarize, expressions in the decision tree (expanding logic tree representation) are much the same as previously described in parent floating gate application Ser. Nos. 13/347,721 and 12/694,199, the contents of which are incorporated herein by reference. However one important exception is that in the present contention art, a new contention state "X" is tested for.

Thus for purposes of contention analysis, it is important to specify the logical conditions under which the new contention state "X" will occur. FIG. 18, as previously discussed, explores these logical conditions in more detail.

Net (1813) will be in contention if any pull-up path and any pull-down path exist together. Hence it is a logical "OR" of multiple conditions, shown by OR term (1832) of multiple conditions (1802), (1804), and (1806).

The expression for net (1813) in contention is:
(1810=1 and 1811=1) or (1810=1 and 1812=1) or (1811=1 and 1812=1)

This is in contrast to the parent floating gate application Ser. Nos. 13/347,721 and 12/694,199, where for floating gate analysis, the expression for net 1813 would be AND-ed together, rather than OR-ed together. That is, in contrast to the previously described floating (Z) case, where the software analyzes for a float condition that must have all drivers off together (all AND), by contrast the contention analysis must have some drivers "on" together (any pairs OR).

Thus for a floating gate analysis, the software would automatically check for:
(1810=1 and 1811=1) and (1810=1 and 1812=1) and (1811=1 and 1812=1)

While for a contention analysis, the software would automatically check for:
(1810=1 and 1811=1) or (1810=1 and 1812=1) or (1811=1 and 1812=1)

Not all contention findings are equally important, and in some embodiments, the invention's software will also attempt to rank various contention findings according to a prioritization scheme.

In some embodiments, this prioritization scheme or list would rank contention findings as follows:

1. Those potential contention digital drivers that are always directly and unconditionally shorted together can be reported as a high priority direct contention type.

2. Those potential contention digital drivers that are only connected together under some conditions can be reported as lower priority conditional contention types, preferably along with a logical tree obtained listing of the conditions under which the conditional contention occurs.

3. Those potential contention digital drivers that are from a net that cannot be automatically determined to be a CMOS digital logic net can be reported as lower priority "proven but unknown circuit type" contention type.

On occasions where the logic tree representation of a previous level of predecessor circuit portions may determine that two or more digital drivers comprise a digital multiplexer or other node between digital drivers such that the digital drivers may be turned on in overlapping states so as to short the outputs of said digital drivers together. In these situations, the contention analysis software can further determine and report that this predecessor circuit portion indicates a potential or conditional contention configuration.

Figure 19:
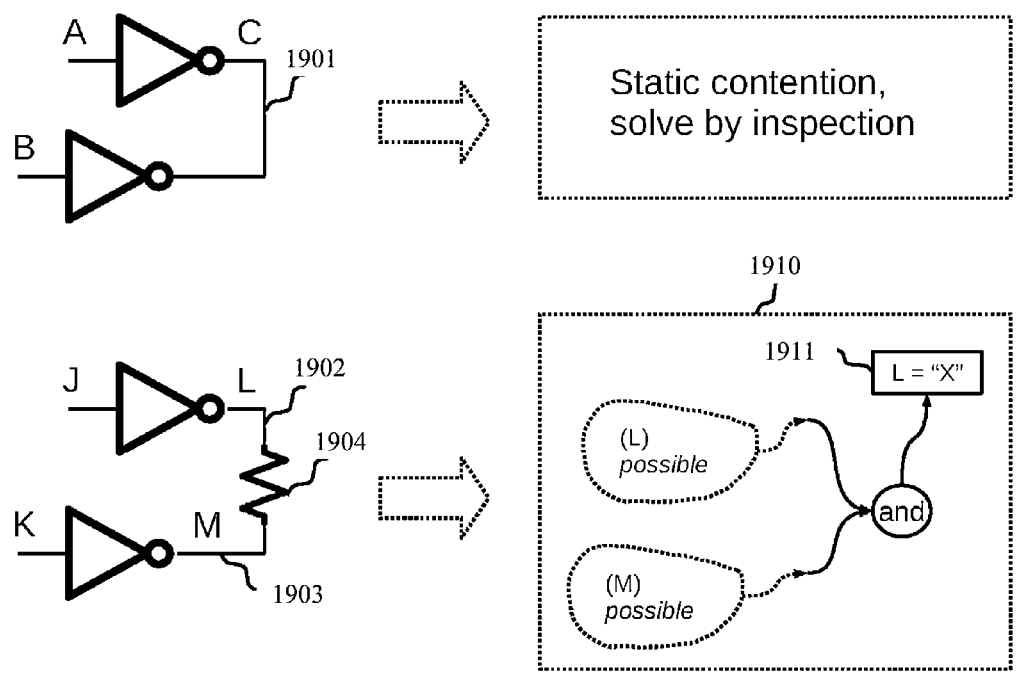
FIG. 19 shows an example of a prioritization scheme by which certain types of contention problems may be reported.

Continuing with the prioritization discussion, FIG. 19 shows an example of a prioritization scheme by which certain types of contention problems may be reported.

Further, while evaluating nets for contention, certain indicators will be encountered that can then be used to prioritize the reported violations. It is beneficial to the end user that the reported violations are prioritized:

As previously discussed, where the output of two logic drivers are directly and unconditionally shorted together (such as in FIG. 19), the software can be configured to recognize that this type of violation is a "direct connection" contention case. That is here, particular, net (1901) is known to be in contention due to a direct, constant connection. As such, the software may report a net such as (1901) may with certain, specific text messages or graphical elements that inform that the user this is a case of "direct connection" type contention.

By contrast, where the output of logic drivers are connected together only under certain conditions, such as in drawing (1800), it the contention analysis software may be configured to report to the user that such certain conditions are necessary for contention to occur. Therefore, the software may report net (1812) with certain specific text messages or graphical elements that inform that this is a case of "conditional contention".

Furthermore, it is often useful to configure the software to further report additional details such as the conditions that result in the conditional contention. These conditions are the expressions (1802), (1804), (1806) that are extracted from the decision tree (1810) that proved this violation (1812).

Where a net is not detected as part of CMOS digital logic, but is proven by decision tree to be in contention, this may be also reported with various specific text message or graphical elements informing that this contention is "proven, but from an unknown circuit type". This is exemplified in FIG. 3B, net (B307). This is an example where the net (B307) is known to be in contention, but, due to its not being identified as CMOS digital logic, this type of contention may be of reduced interest to the end user.

Note further that Net (1901) is directly connected to the output nodes of CMOS digital logic (as previously discussed in FIG. 14). Because there are multiple such output nodes on net (1901), the software may be configured to conclude by inspection that (1901) is unconditionally in contention, and should be directly reported (e.g. reported with high priority).

As another example, Net (1902) is connected to net (1903) through resistor (1904). Each of net (1902) and (1903) has CMOS digital logic drivers connected. Because only a single logic driver is connected to these nets, this case evades detection by inspection (net 1901, above), thereby having a decision tree (1910) constructed for it. In decision tree (1910), the expressions for nets (1902) and (1903) are reduced to "possible" (as described in FIG. 17), and the resultant hypothesis (1711) is proven true. Thus the software can be configured to report that net (1702) is also in contention.

Based on the various categorization, above, and other priority rankings, often with specific text messages or graphical indicators that describe the violations, these violations may then be assigned relative ranking, or priority, in order to guide the end user to the most important violations first.

Figure 20:
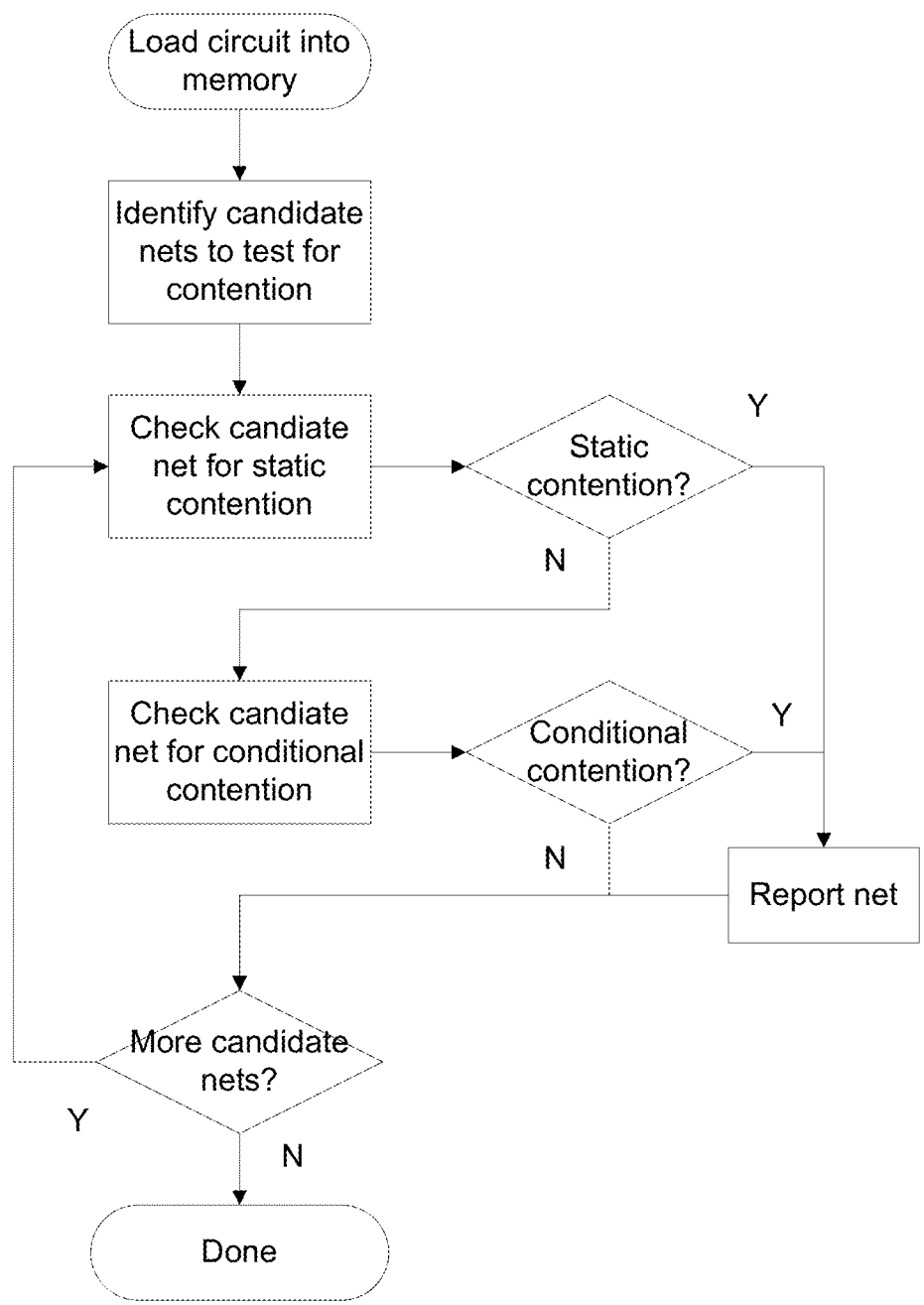
FIG. 20 shows a flow chart of how the invention's software may perform the contention analysis.

FIG. 20 shows an alternate flow chart, showing another perspective and embodiment on how the invention's software may perform the overall contention analysis.

The invention claimed is:

1. A computerized software implemented method for identifying instances of digital drivers that are in a contention configuration which creates multiple conflicting current paths with respect to power or ground nets in a specification of an electronic circuit design of a netlist of a complex integrated circuit chip comprising a plurality of nets and electrically interconnected transistors, said method comprising:
   obtaining said electronic circuit design in a computer readable form;
   using at least one computer processor to perform the steps of:
   automatically determining which of said transistors are configured as digital drivers;
   for at each net comprised of a plurality of digital drivers for which an analysis is desired, performing a logic expansion to create an expanding logic tree representation of a previous level of predecessor circuit portions that drive a state of each digital driver of said plurality of digital drivers, and determining if any states of predecessor nodes in the previous level of the predecessor circuit portions are simultaneously to create a pull up path to said power net and a pull down path to said ground net, thereby indicating a potential contention configuration;
   repeating said logic expansion for the next previous levels of the predecessor circuit portions, seeking logical conflicts within the expanding logic tree representation, until it can be determined that either no predecessor circuit portion can cause said potential contention configuration, or until a predecessor circuit portion that does cause said potential contention configuration is identified; and
   if such predecessor circuit portion that does cause said potential contention configuration is identified, reporting an identity of each digital driver in said predecessor circuit portion as a potential contention digital driver.

2. The method of claim 1, wherein said expanding logic tree representation is a Boolean logic tree, and wherein said method provides a logical proof to identify that said digital driver in said predecessor circuit portion is a potential contention digital driver.

3. The method of claim 1, further analyzing said potential contention digital drivers through either a list of exclusions, and/or a prioritization list, and then reporting at least non-excluded results to a user listed by priority.

4. The method of claim 3, wherein said prioritization list ranks on the basis of:
   a) those potential contention digital drivers that are always directly and unconditionally shorted together are reported as a high priority direct contention type;
   b) those potential contention digital drivers that are only connected together under some conditions are reported as lower priority conditional contention types, along with a logical tree obtained listing of the conditions under which the conditional contention occurs;

c) those potential contention digital drivers that are from a net that cannot be automatically determined to be a CMOS digital logic net are reported as lower priority proven but unknown circuit type contention type.

5. The method of claim 1, further identifying, without requiring a-prioi knowledge of which of said nets are power or ground nets, those nets that are statistically likely to be power or ground nets, said method comprising:
using at least one computer processor, software, and memory to analyze said nets from said netlist, and for each analyzed net:
a) determining electrical properties of each device or device terminal that is coupled to said analyzed net, and sorting said electrical properties for each device or device terminal into a series of bins, thereby creating a mathematical description of overall electrical properties of various devices that are coupled to said analyzed net;
b) comparing said mathematical description with at least one preset mathematical description of a power net or a ground net; and
if said mathematical description falls within said at least one preset mathematical description of a power net or a ground net, then at least provisionally determining that said analyzed net is a power net or a ground net, and storing a result of said determining in memory for later use.

6. The method of claim 1, wherein said digital drivers comprise PFET and NFET devices or a combination of PFET and NFET devices.

7. The method of claim 1, wherein said digital drivers are determined by automatically tracing NFET pull down paths to said ground nets, and PFET pull up paths to said power nets, and determining that a gating signal controlling said NFET pull down paths also is a gating signal controlling said PFET pull up paths.

8. The method of claim 1, wherein if said expanding logic tree representation of a previous level of predecessor circuit portions determines that two or more digital drivers in said predecessor circuit portion have outputs connected together, thus forming a short circuit, then further determining that said predecessor circuit portion indicates a potential contention configuration.

9. The method of claim 1, wherein if said expanding logic tree representation of a previous level of predecessor circuit portions determines that two or more digital drivers comprise a digital multiplexer or other node between digital drivers, wherein said multiplexer or node is switched on in overlapping states so as to short the outputs of said digital drivers together, then further determining that said predecessor circuit portion indicates a potential or conditional contention configuration.

10. The method of claim 1, wherein selecting nets for the desired analysis is done by selecting those nets in said electronic circuit design that connect either directly, or by DC resistive paths, to both PFET and NFET devices at either the PFET source or drain pins, or the NFET source or drain pins.

11. The method of claim 10, wherein selecting nets for the desired analysis is further narrowed by further selecting those nets that are determined to have CMOS digital logic outputs, but not connected to analog circuit portions of said electronic circuit design;
wherein the analog circuit portions of said electronic circuit design comprise at least one of diodes, diode-tied FETS, capacitors, capacitor-tied FETs, or bipolar transistors.

12. The method of claim 11, wherein selecting nets for the desired analysis is further narrowed by further giving higher analysis priority to nets that either span across multiple logic circuit portions of said electronic circuit design, or which are connected to signal paths of switch components of said electronic circuit design;
and then reporting analysis results to a user in a manner that gives higher priority to nets that either span across multiple logic circuit portions of said electronic circuit design, or which are connected to signal paths of switch components of said electronic circuit design.

13. The method of claim 1, further identifying transfer switches in said previous level of predecessor circuit portions, and simplifying said expanding logic tree representation by avoiding further consideration of digital signals driven through said transfer switches, and instead finding switch control conditions where said digital signals are shorted together.

14. A computerized software implemented method for identifying instances of digital drivers that are in a contention configuration which creates multiple conflicting current paths with respect to power or ground nets in a specification of an electronic circuit design of a netlist of a complex integrated circuit chip comprising a plurality of nets and electrically interconnected transistors, said method comprising:
obtaining said electronic circuit design in a computer readable form;
using at least one computer processor to perform the steps of:
automatically determining those nets that are statistically likely to be power or ground nets;
automatically determining which of said transistors are configured as digital drivers;
wherein said digital drivers comprise PFET and NFET devices or a combination of PFET and NFET devices;
wherein said digital drivers are determined by automatically tracing NFET pull down paths to said ground nets, and PFET pull up paths to said power nets, and determining that a gating signal controlling said NFET pull down paths also is a gating signal controlling said PFET pull up paths;
for at each net comprised of a plurality of digital drivers for which an analysis is desired, performing a logic expansion to create an expanding logic tree representation of a previous level of predecessor circuit portions that drive a state of each said digital driver of said plurality of digital drivers, and determining if any states of predecessor nodes in the previous level of the predecessor circuit portions are simultaneously to create a pull up path to said power net and a pull down path to said ground net, thereby indicating a potential contention configuration;
wherein said expanding logic tree representation is a Boolean logic tree, and wherein said method provides a logical proof to identify that said digital driver in said predecessor circuit portion is a potential contention digital driver;
repeating said logic expansion for the next previous levels of the predecessor circuit portions, seeking logical conflicts within the expanding logic tree representation, until it can be determined that either no predecessor circuit portion can cause said potential contention configuration, or until a predecessor circuit portion that does cause said potential contention configuration is identified; and
if such predecessor circuit portion that does cause said potential contention configuration is identified, further analyzing said potential contention digital drivers through either a list of exclusions, and/or a prioritization list, and then reporting, listed by priority at least non-excluded results and identity of each digital driver in said predecessor circuit portion as a potential contention digital driver.

15. The method of claim 14, wherein said prioritization list ranks on the basis of:
   a) those potential contention digital drivers that are always directly and unconditionally shorted together are reported as a high priority direct contention type;
   b) those potential contention digital drivers that are only connected together under some conditions are reported as lower priority conditional contention types, along with a logical tree obtained listing of the conditions under which the conditional contention occurs;
   c) those potential contention digital drivers that are from a net that cannot be automatically determined to be a CMOS digital logic net are reported as lower priority proven but unknown circuit type contention type.

16. The method of claim 14, wherein if said expanding logic tree representation of a previous level of predecessor circuit portions determines that two or more digital drivers in said predecessor circuit portion have outputs connected together, thus forming a short circuit, then further determining that said predecessor circuit portion indicates a potential contention configuration; and
   wherein if said expanding logic tree representation of a previous level of predecessor circuit portions determines that two or more digital drivers comprise a digital multiplexer or other node between digital drivers, wherein said multiplexer or node is switched on in overlapping states so as to short the outputs of said digital drivers together, then further determining that said predecessor circuit portion indicates a potential contention configuration.

17. The method of claim 14, wherein selecting nets for the desired analysis is done by selecting those nets in said electronic circuit design that connect either directly, or by DC resistive paths, to both PFET and NFET devices at either the PFET source or drain pins, or the NFET source or drain pins; and
   wherein selecting nets for the desired analysis is further narrowed by further selecting those nets that are determined to have CMOS digital logic outputs, but not connected to analog circuit portions of said electronic circuit design;
   wherein the analog circuit portions of said electronic circuit design comprise at least one of diodes, diode-tied FETS, capacitors, capacitor-tied FETs, or bipolar transistors.

18. The method of claim 17, wherein selecting nets for the desired analysis is further narrowed by further giving higher analysis priority to nets that either span across multiple logic circuit portions of said electronic circuit design, or which are connected to signal paths of switch components of said electronic circuit design;
   and then reporting analysis results to a user in a manner that gives higher priority to nets that either span across multiple logic circuit portions of said electronic circuit design, or which are connected to signal paths of switch components of said electronic circuit design.

19. The method of claim 14, wherein automatically determining those nets that are statistically likely to be power or ground nets comprises further identifying, without requiring a-prioi knowledge of which of said nets are power or ground nets, those nets that are statistically likely to be power or ground nets, said method comprising:
   using at least one computer processor, software, and memory to analyze said nets from said netlist, and for each analyzed net:
   a) determining electrical properties of each device or device terminal that is coupled to said analyzed net, and sorting said electrical properties for each device or device terminal into a series of bins, thereby creating a mathematical description of overall electrical properties of various devices that are coupled to said analyzed net;
   b) comparing said mathematical description with at least one preset mathematical description of a power net or a ground net; and
   if said mathematical description falls within said at least one preset mathematical description of a power net or a ground net, then at least provisionally determining that said analyzed net is a power net or a ground net, and storing a result of said determining in memory for later use.

20. A computerized software implemented method for identifying instances of drivers that are in a contention configuration which creates multiple conflicting current paths with respect to power or ground nets in a specification of an electronic circuit design of a netlist of a complex integrated circuit chip comprising a plurality of nets and electrically interconnected transistors, said method comprising:
   obtaining said electronic circuit design in a computer readable form;
   using at least one computer processor to perform the steps of:
   automatically determining which of said transistors are configured as drivers;
   for at each net comprised of a plurality of drivers for which an analysis is desired, performing a logic expansion to create an expanding logic tree representation of a previous level of predecessor circuit portions that drive a state of each said driver, and determining if any states of predecessor nodes in the previous level of the predecessor circuit portions are simultaneously to create a pull up path to said power net and a pull down path to said ground net, thereby indicating a potential contention configuration;
   repeating said logic expansion for the next previous levels of the predecessor circuit portions, seeking logical conflicts within the expanding logic tree representation, until it can be determined that either no predecessor circuit portion can cause said potential contention configuration, or until a predecessor circuit portion that does cause said potential contention configuration is identified; and
   if such predecessor circuit portion that does cause said potential contention configuration is identified, reporting an identity of each driver in said predecessor circuit portion as a potential contention driver.

21. The method of claim 20, wherein said drivers are digital drivers.

* * * * *